US010773520B2

(12) United States Patent
Mori et al.

(10) Patent No.: US 10,773,520 B2
(45) Date of Patent: Sep. 15, 2020

(54) LIQUID EJECTION APPARATUS

(71) Applicant: BROTHER KOGYO KABUSHIKI KAISHA, Nagoya-shi, Aichi-ken (JP)

(72) Inventors: Shogo Mori, Nagoya (JP); Motohiro Tsuboi, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 16/139,572

(22) Filed: Sep. 24, 2018

(65) Prior Publication Data
US 2019/0100001 A1 Apr. 4, 2019

(30) Foreign Application Priority Data
Sep. 29, 2017 (JP) ................. 2017-192090

(51) Int. Cl.
*B41J 2/14* (2006.01)
*H05K 7/20* (2006.01)
*B41J 2/155* (2006.01)

(52) U.S. Cl.
CPC ............. *B41J 2/14* (2013.01); *B41J 2/14233* (2013.01); *B41J 2/155* (2013.01); *H05K 7/20436* (2013.01); *B41J 2002/14266* (2013.01); *B41J 2002/14306* (2013.01); *B41J 2002/14362* (2013.01); *B41J 2002/14491* (2013.01); *B41J 2202/08* (2013.01); *B41J 2202/21* (2013.01)

(58) Field of Classification Search
CPC .......... B41J 2002/14419; B41J 2/14233; B41J 2002/14491; B41J 2002/14306; B41J 2002/14362; B41J 2/155; B41J 2002/14266; B41J 2202/21; B41J 2/04541; B41J 2/14; B41J 2202/08; H05K 7/20436
See application file for complete search history.

(56) References Cited

FOREIGN PATENT DOCUMENTS

| JP | 2016-101720 A | 6/2016 |
| JP | 2017-65041 A | 4/2017 |
| JP | 2018171855 A | * 11/2018 |

* cited by examiner

*Primary Examiner* — Jannelle M Lebron
(74) *Attorney, Agent, or Firm* — Merchant & Gould P.C.

(57) ABSTRACT

A liquid ejection apparatus, including: a channel structure in which a channel is formed; an actuator stacked on the channel structure in a stacking direction, the actuator configured to cause a liquid in the channel to be ejected; a first frame formed of metal and stacked on the channel structure in the stacking direction; a driver integrated circuit (IC) electrically connected to the actuator; and a second frame formed of metal, the second frame including at least two side walls facing each other and an upper wall extending between the two side walls and extending in a direction orthogonal to the stacking direction, the second frame being thermally connected to the first frame, wherein the driver IC is disposed between the two side walls, and the upper wall of the second frame is thermally connected to the driver IC.

15 Claims, 19 Drawing Sheets

FIG.4
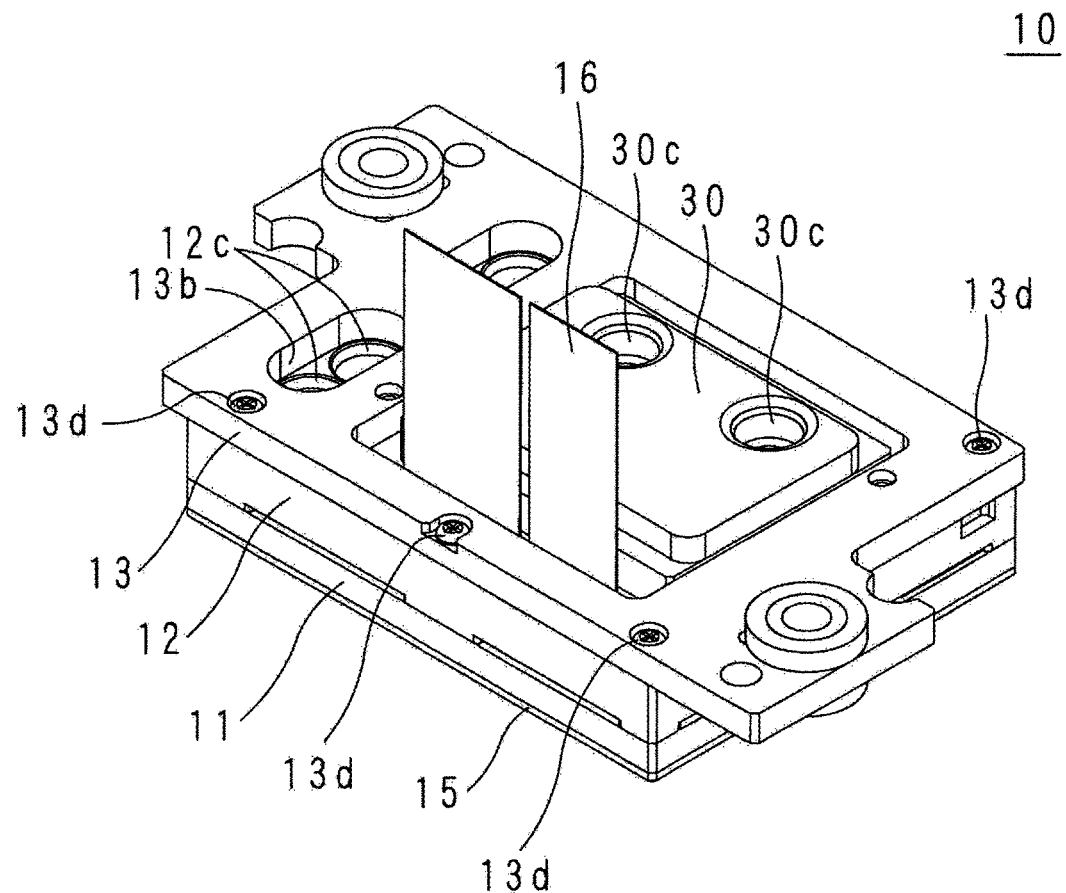
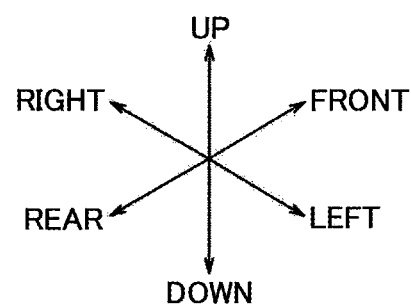

FIG.10
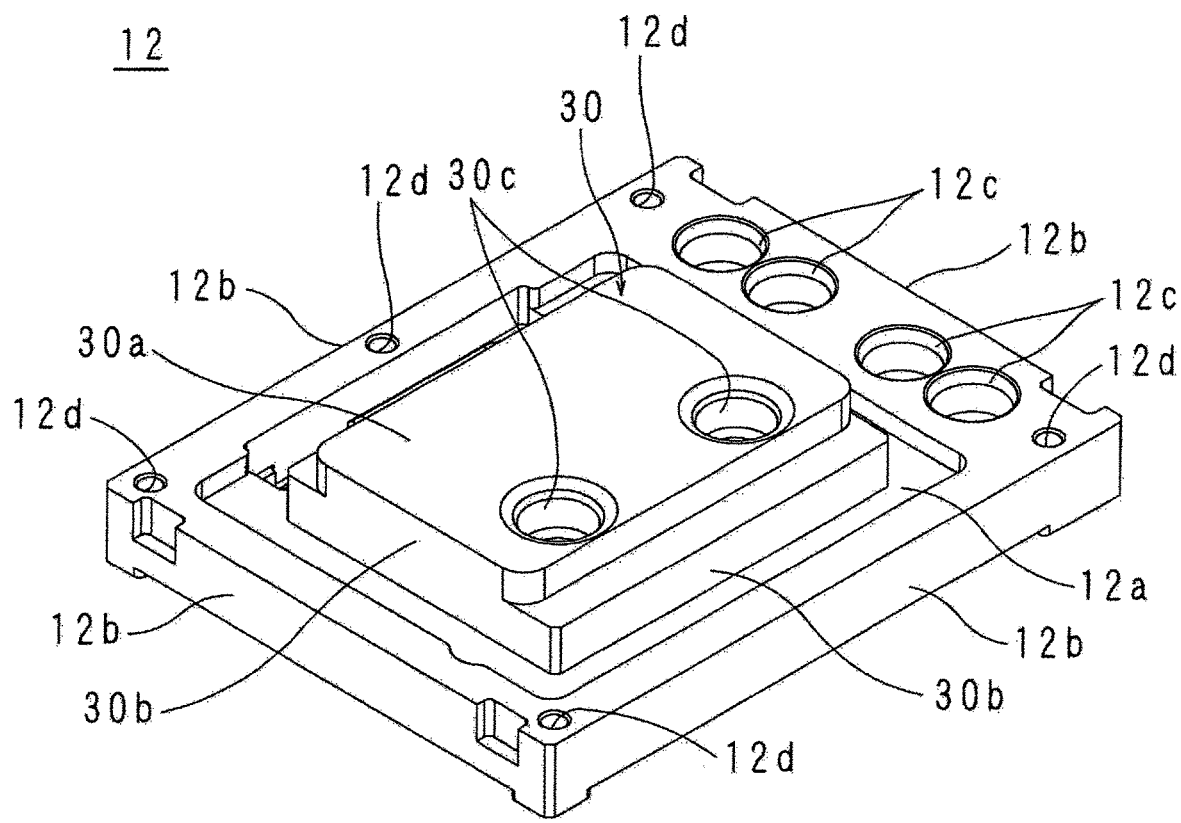
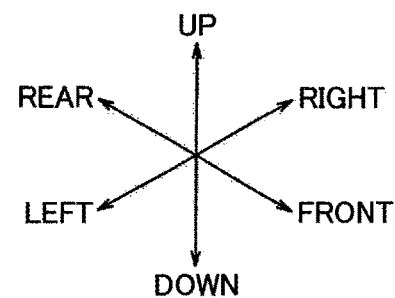

FIG.11
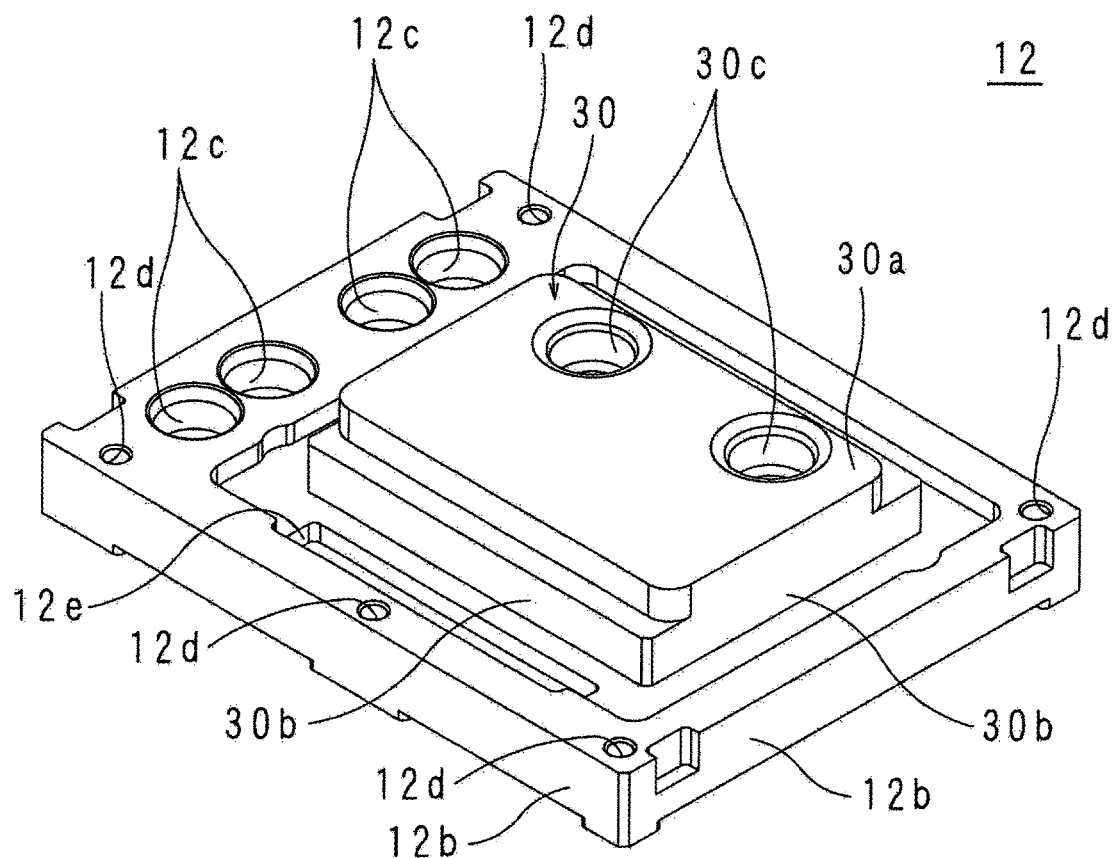
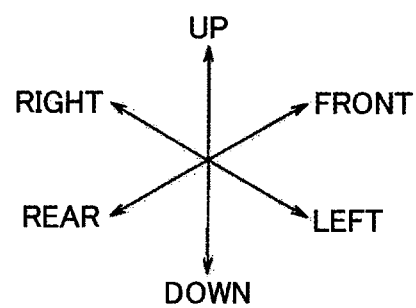

FIG.17
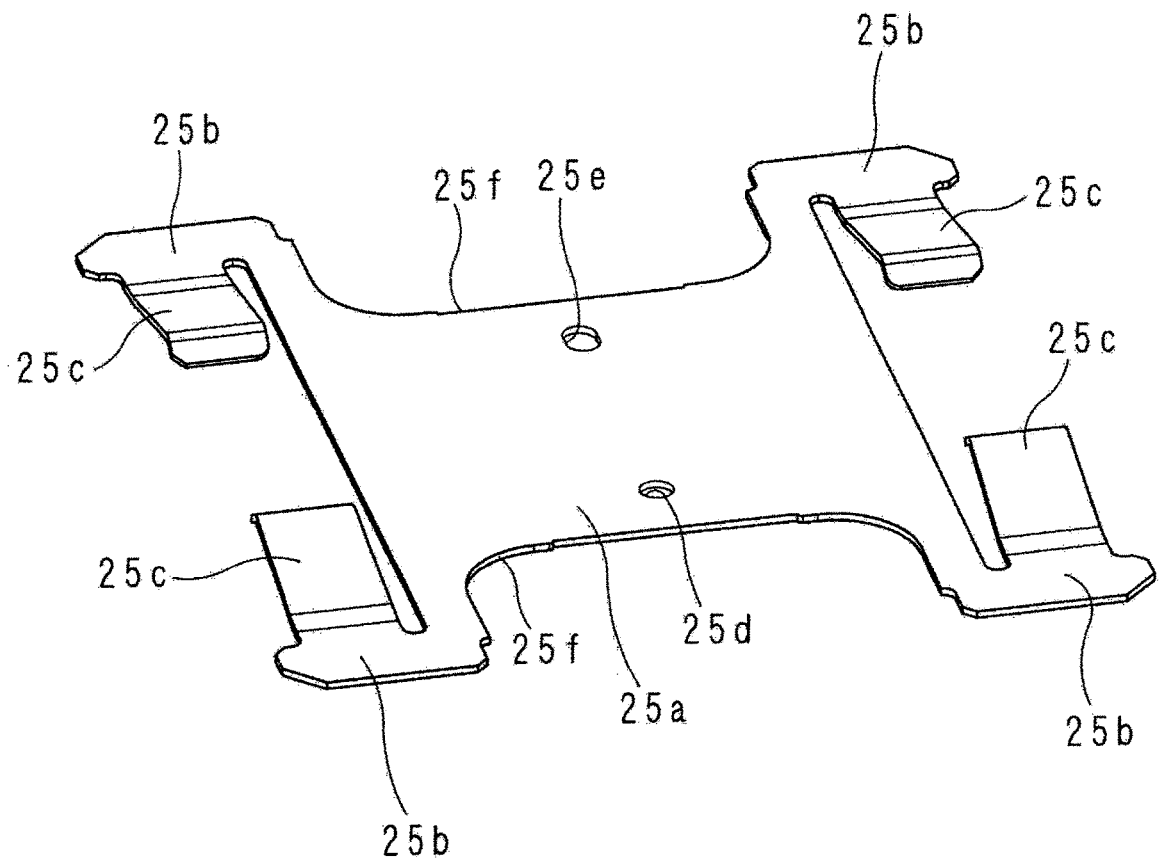
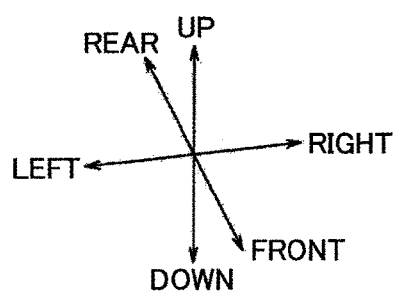

US 10,773,520 B2

LIQUID EJECTION APPARATUS

CROSS REFERENCE TO RELATED APPLICATION

The present application claims priority from Japanese Patent Application No. 2017-192090, which was filed on Sep. 29, 2017, the disclosure of which is herein incorporated by reference in its entirety.

BACKGROUND

Technical Field

The following disclosure relates to a liquid ejection apparatus configured to eject a liquid.

Description of Related Art

The liquid ejection apparatus includes: a head including a channel for a liquid and an actuator configured to cause the liquid in the channel to be ejected; and a driver integrated circuit (IC) for driving the actuator. In the case where the liquid ejection apparatus continuously performs an ejection operation of ejecting the liquid, there may be caused a temperature rise due to heat generated by the head and the driver IC.

A liquid ejection head is known which aims at efficiently dissipating the heat of the driver IC. The known liquid ejection head includes a heat dissipating plate for dissipating the heat of the driver IC and a pressing member for pressing the driver IC toward the heat dissipating plate.

SUMMARY

Such a structure of the known liquid ejection head is unique to that head, and it is difficult to apply the structure to other heads.

Accordingly, one aspect of the present disclosure relates to a liquid ejection apparatus having a novel structure for heat dissipation or cooling.

One aspect of the present disclosure relates to a liquid ejection apparatus, including: a channel structure in which a channel is formed; an actuator stacked on the channel structure in a stacking direction, the actuator configured to cause a liquid in the channel to be ejected; a first frame formed of metal and stacked on the channel structure in the stacking direction; a driver integrated circuit (IC) electrically connected to the actuator; and a second frame formed of metal, the second frame including at least two side walls facing each other and an upper wall extending between the two side walls and extending in a direction orthogonal to the stacking direction, the second frame being thermally connected to the first frame, wherein the driver IC is disposed between the two side walls, and the upper wall of the second frame is thermally connected to the driver IC.

Another aspect of the present disclosure relates to a liquid ejection apparatus, including: a channel structure in which a channel is formed; an actuator stacked on the channel structure in a stacking direction, the actuator configured to cause a liquid in the channel to be ejected; a first frame formed of metal and stacked on the channel structure in the stacking direction; a driver integrated circuit (IC) electrically connected to the actuator; and a second frame formed of metal and thermally connected to the first frame, wherein the second frame is shaped to surround the driver IC, wherein the driver IC is surrounded by the second frame and thermally connected to the second frame, and wherein a liquid chamber is formed in the second frame.

BRIEF DESCRIPTION OF THE DRAWINGS

The objects, features, advantages, and technical and industrial significance of the present disclosure will be better understood by reading the following detailed description of an embodiment, when considered in connection with the accompanying drawings, in which:

FIG. 4 is a perspective view showing the overall structure of the head module;
FIG. 10 is a perspective view of a second frame;
FIG. 11 is a perspective view of the second frame;
FIG. 17 is a perspective view of a biasing member.

DETAILED DESCRIPTION OF THE EMBODIMENT

Figure 1:
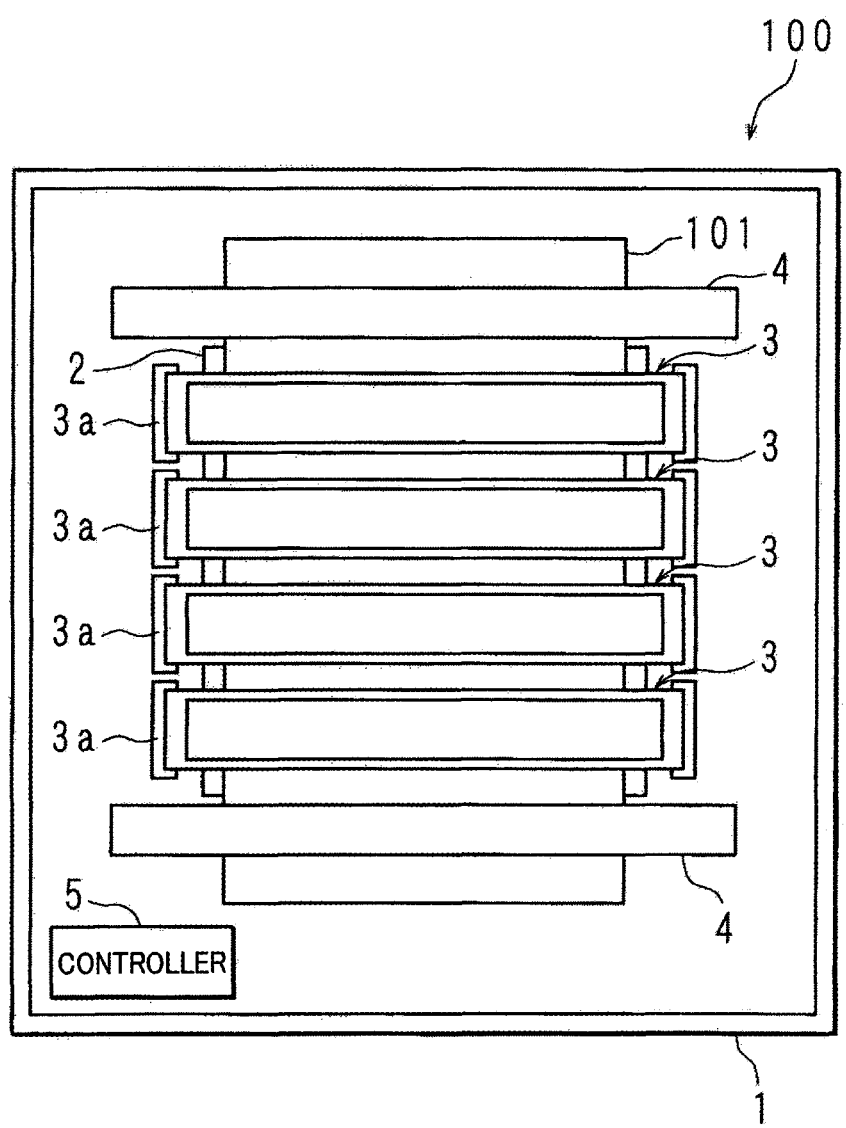
FIG. 1 is a schematic view showing a structure of a printer according to one embodiment.

As shown in the schematic view of FIG. 1, a printer 100 according to one embodiment includes a housing 1, a platen 2 disposed in the housing 1, four ink-jet heads 3, two rollers 4, and a controller 5. Directions, i.e., a front-rear direction, a right-left direction, and an up-down direction, used in the following explanation are based on directions indicated in the drawings.

A recording sheet 101 on which a printing is performed by the printer 100 is conveyed on the platen 2. For instance, the recording sheet 101 is conveyed on the platen in the front-rear direction. The two rollers 4 are respectively positioned on a front side and a rear side of the platen 2. The recording sheet 101 is conveyed from the rear side toward the front side by rotation of the two rollers 4.

Each ink-jet head 3 is shaped like a rectangular plate elongated in the right-left direction and is opposed to the platen 2 in the up-down direction. When the recording sheet 101 is positioned on the platen 2, the ink-jet head 3 is opposed to a sheet plane of the recording sheet 101. Each ink-jet head 3 is held at its opposite ends in the right-left direction by a corresponding holding member 3a. The four ink-jet heads 3 are disposed between the two rollers 4 in the front-rear direction.

Each ink-jet head 3 corresponds to one ink color. For instance, the four ink-jet heads 3 corresponds to cyan, magenta, yellow, and black. The number of the ink-jet heads 3 is not limited to four.

The controller 5 includes a Central Processing Unit (CPU), a Field-Programmable Gate Array (FPGA), a Read Only Memory (ROM), a Random Access Memory (RAM), and an Electrically Erasable Programmable Read-Only Memory (EEPROM). The CPU, the FPGA, the ROM, the RAM, and the EEPROM are not illustrated. The controller 5 is communicable with an external apparatus such as a personal computer. The controller 5 controls operations of the four ink-jet heads 3 and the two rollers 4 according to programs stored in the ROM based on an instruction from the external apparatus or an instruction from an operation panel (not shown) of the printer 100.

The controller 5 actuates a motor (not shown) for driving the two rollers 4, so as to control the operation of the two rollers 4 for conveying the recording sheet 101. While the recording sheet 101 is being conveyed on the platen 2, the controller 5 causes each ink-jet head 3 to operate for ejecting the ink.

Figure 2:
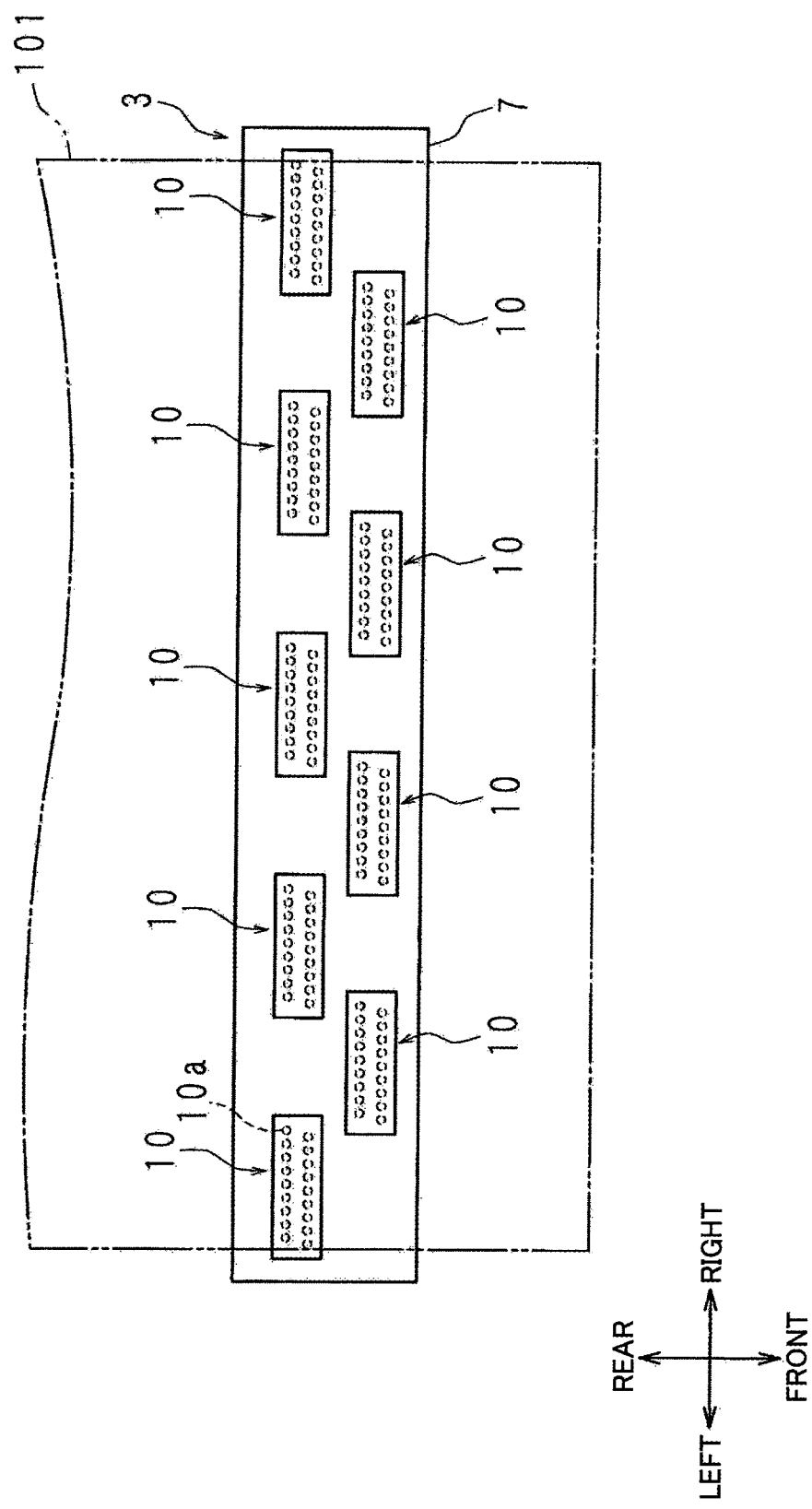
FIG. 2 is a schematic view of an ink-jet head.

In the schematic view of FIG. 2 showing the structure of the ink-jet head 3, the ink-jet head 3 is viewed from the bottom. As shown in FIG. 2, the ink-jet head 3 includes a rectangular support plate 7 and a plurality of head modules 10 (i.e., nine head modules 10 in FIG. 2) held by the support plate 7.

The plurality of head modules 10 are held by the support plate 7 so as to be arranged in two rows in the front-rear direction, namely, a front row and a rear row. In FIG. 2, four head modules 10 are arranged in the right-left direction in the front row, and five head modules 10 are arranged in the right-left direction in the rear row. The number of the head modules 10 is not limited to the particular number. Ejection openings 10a through which the ink is ejected are formed in a surface of each head module 10 facing the platen 2. It is noted that FIG. 2 is a schematic view and the number of the ejection openings 10a illustrated in FIG. 2 is smaller than the actual number.

In the ink-jet head 3, a reservoir (not shown) for storing ink is disposed above the support plate 7. The reservoir is connected to a tank (not shown). The reservoir receives the ink supplied from the tank and stores a predetermined amount of the ink. The reservoir is connected to the head modules 10 via pipes (not shown), and the ink is supplied from the reservoir to the head modules 10.

Figure 3:
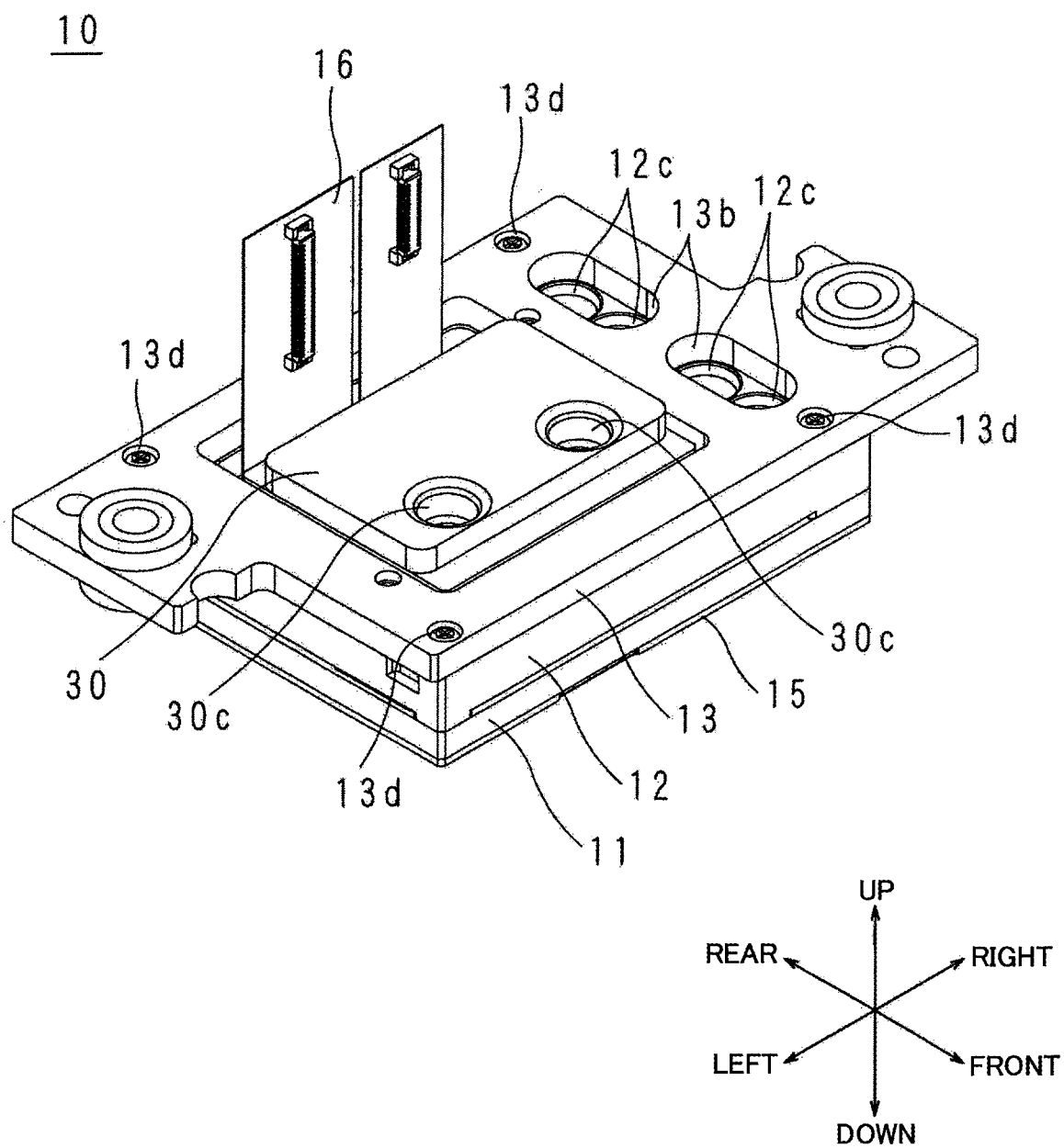
FIG. 3 is a perspective view showing an overall structure of a head module.
Figure 5:
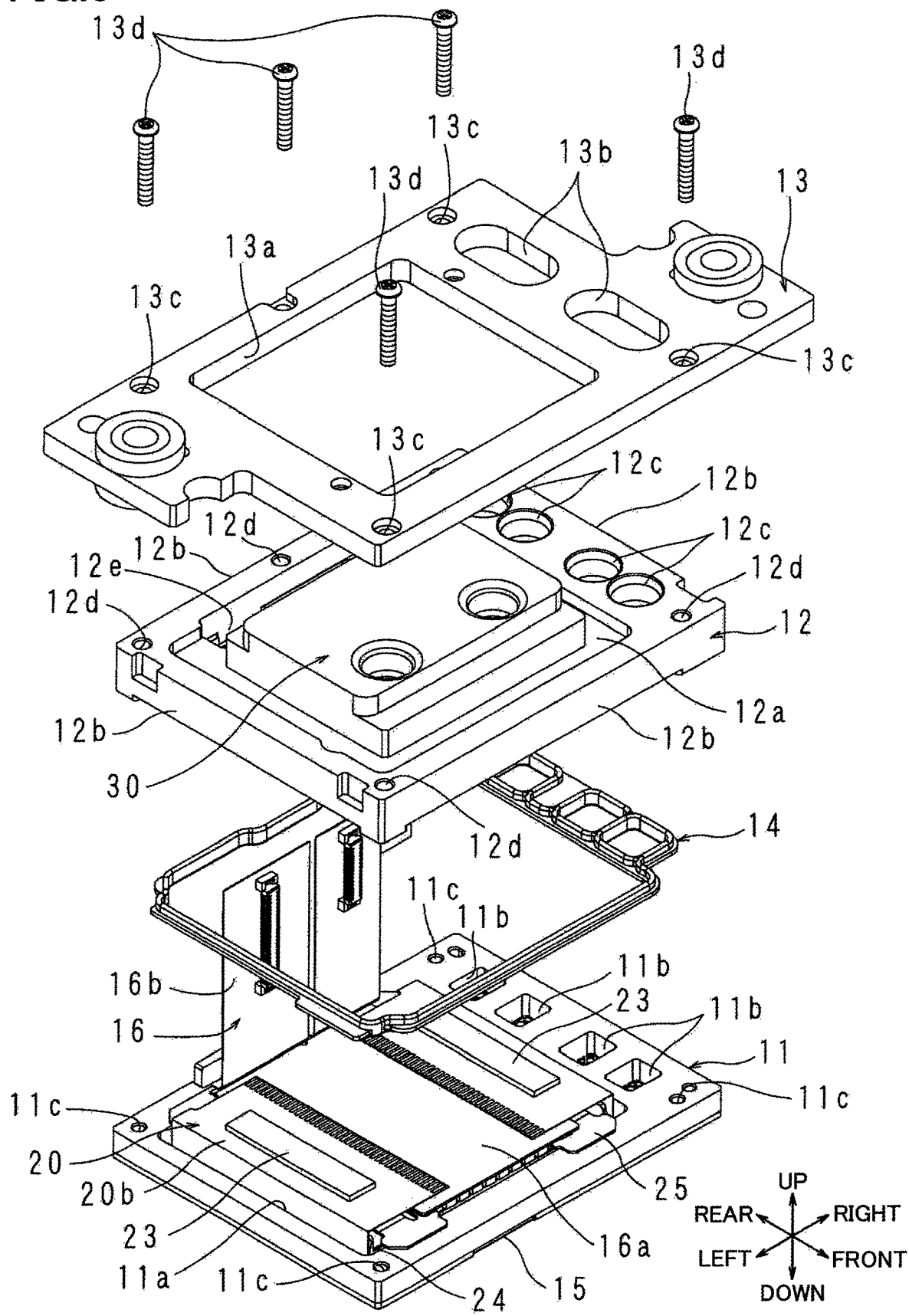
FIG. 5 is an exploded perspective view of the head module.
Figure 6:
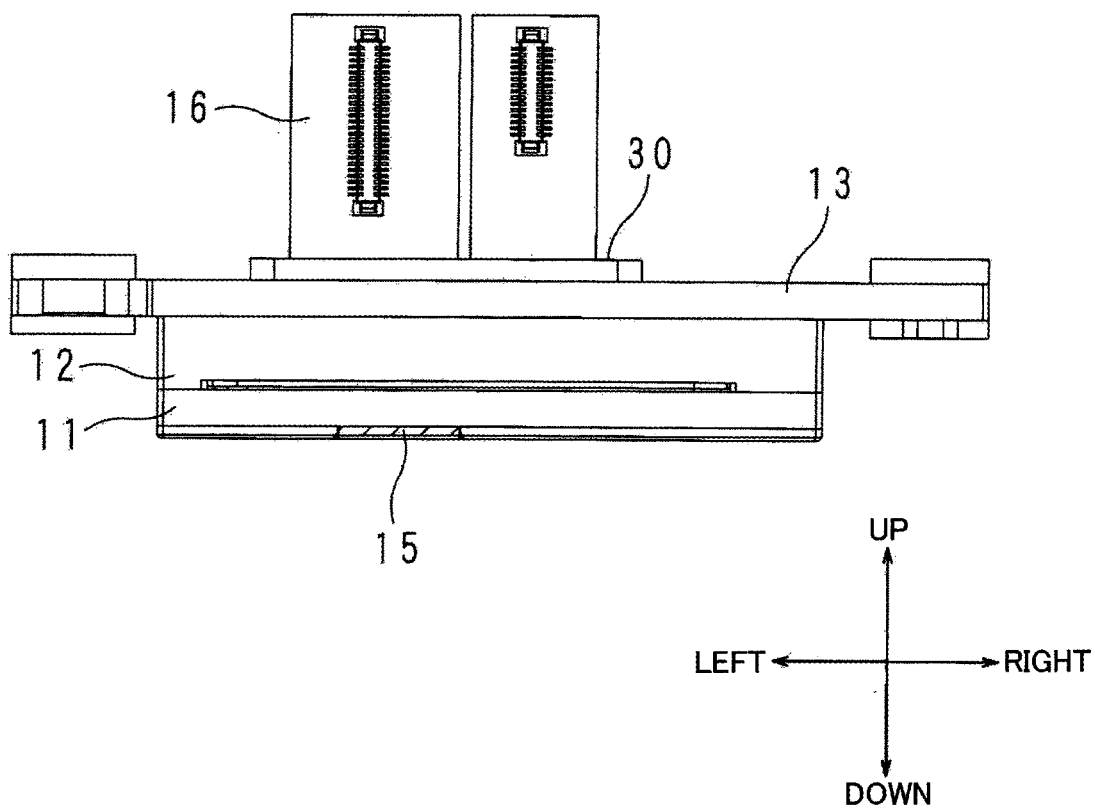
FIG. 6 is a front view of the head module.
Figure 7:
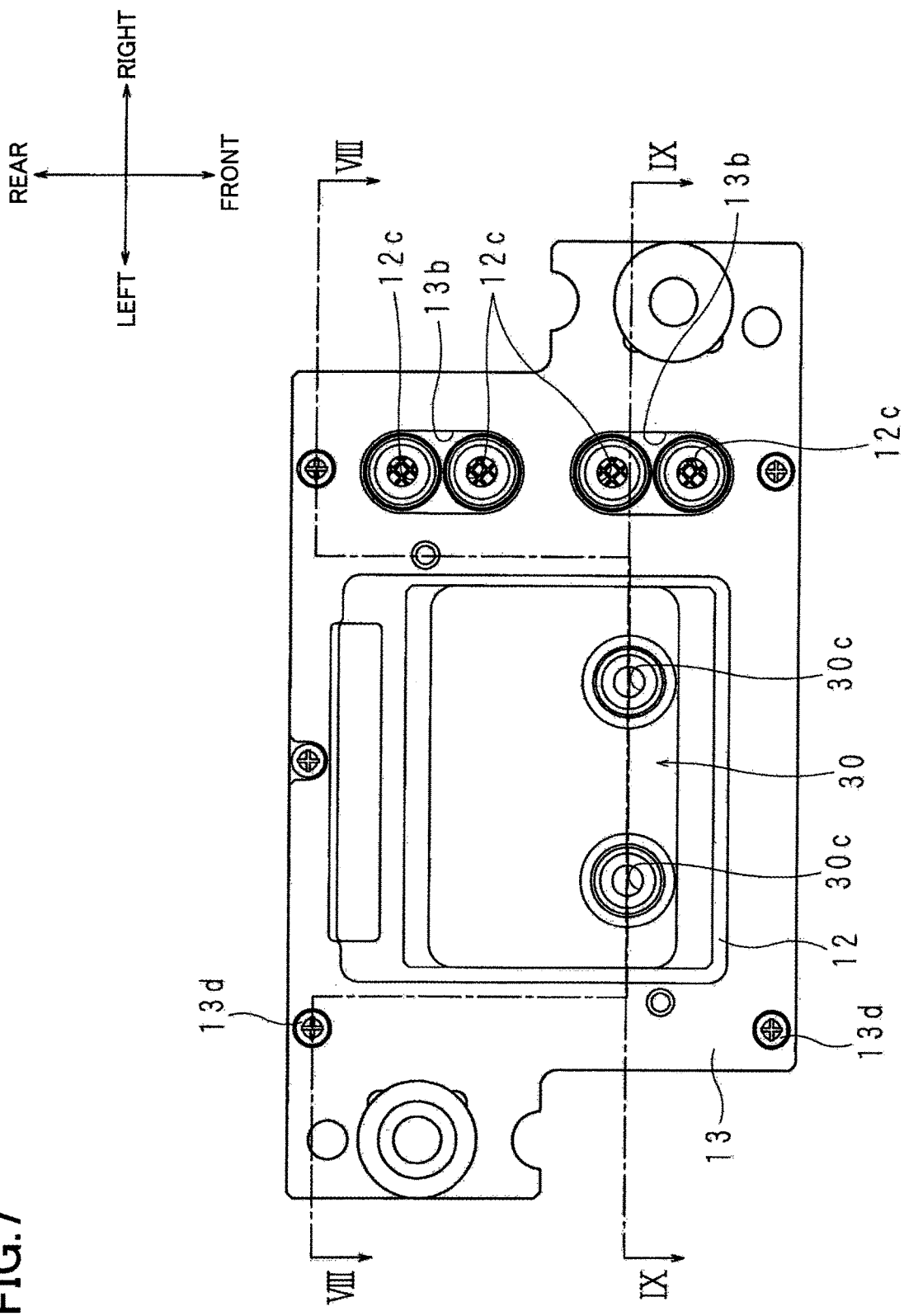
FIG. 7 is a top view of the head module.
Figure 8:
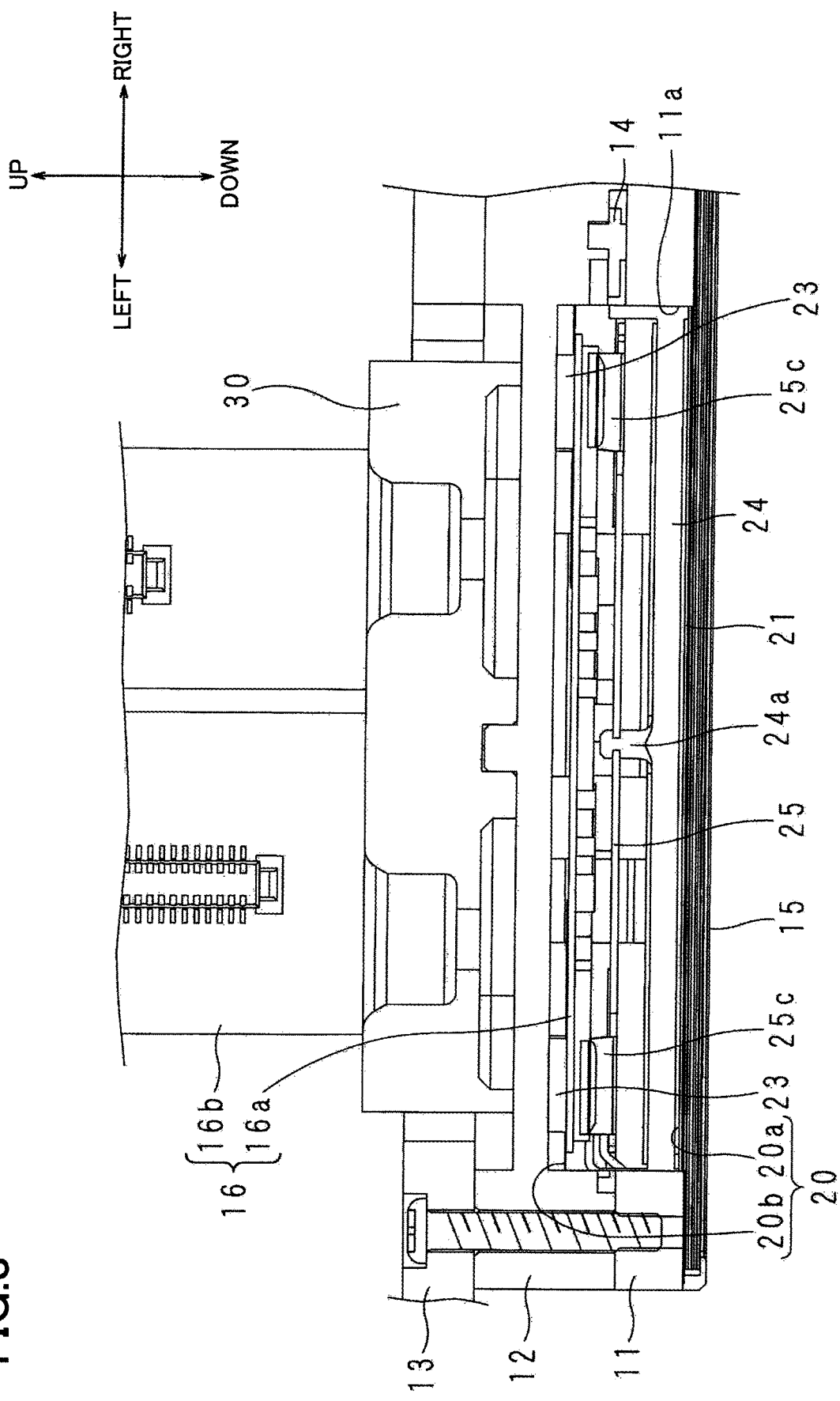
FIG. 8 is a cross-sectional view taken along line VIII-VIII in FIG. 7.
Figure 9:
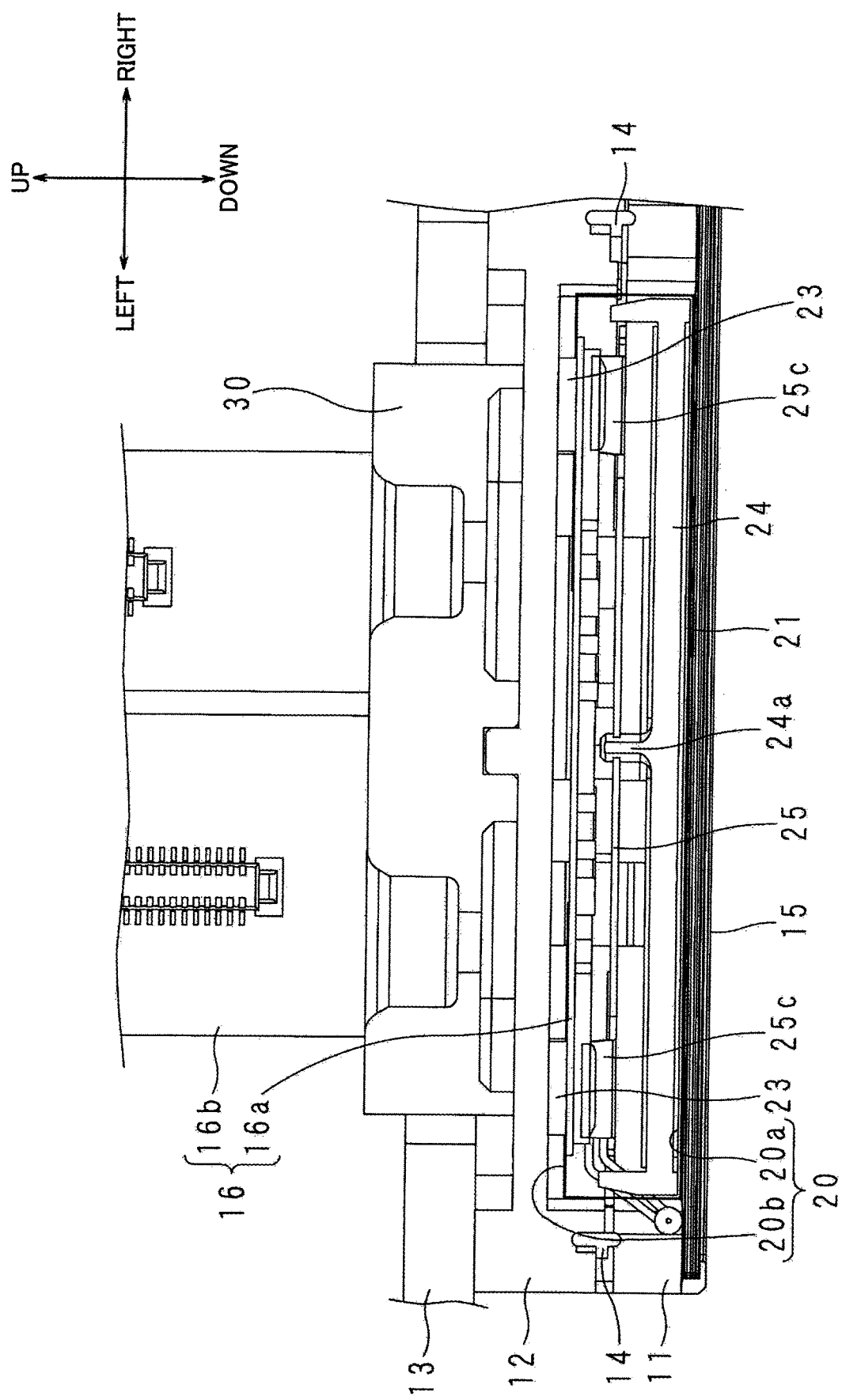
FIG. 9 is a cross-sectional view taken along line IX-IX in FIG. 7.

FIGS. 3 and 4 are perspective views showing an overall structure of the head module 10. FIG. 5 is an exploded perspective view of the head module 10. FIG. 6 is a front view of the head module 10. FIG. 7 is a top view of the head module 10. FIG. 8 is a cross-sectional view taken along line VIII-VIII in FIG. 7. FIG. 9 is a cross-sectional view taken along a line IX-IX in FIG. 7.

The nine head modules 10 are identical to each other in construction. As shown in FIG. 5, the head module 10 includes a first frame 11, a second frame 12, a holder 13, a gasket 14, a channel structure 15, a flexible printed circuit (FPC) 16, and a chip on film (COF) 20. The channel structure 15 is fixed to and supported by a lower surface of the first frame 11. The second frame 12 is superposed on an upper surface of the first frame 11 with the gasket 14 interposed therebetween. The COF 20 is disposed in a space enclosed with the first frame 11, the second frame 12, and the channel structure 15. The COF 20 includes an FPC and two driver ICs 23 mounted on the FPC. To the COF 20, the FPC 16 is electrically connected. The FPC 16 extends outside the head module 10 through a through-hole 12 formed in the second frame 12. The holder 13 is fixed to an upper surface of the second frame 12. Thus, the holder 13 holds the first frame 11, the second frame 12, and the channel structure 15. The holder 13 is fixed to the support plate 7, whereby the head module 10 is supported by the support plate 7. The first frame 11 and the second frame 12 are superposed on each other with the gasket 14 interposed therebetween. In this respect, the gasket 14 is disposed in grooves formed in a lower surface of the second frame 12 as explained later. Thus, at least a part of the region of the lower surface of the second frame 12 is held in contact with the upper surface of the first frame 11. The state in which at least a part of the region of the second frame 12 is held in contact with the upper surface of the first frame 11 is one example of a thermally connected state of the second frame 12 to the first frame 11.

The first frame 11 is formed of metal and has a rectangular shape elongated in the right-left direction. The first frame 11 is formed of metal having high thermal conductivity such as stainless steel. The material for the first frame 11 is not limited to stainless steel but may be other than stainless steel as long as the material has a suitable strength and thermal conductivity. As shown in FIG. 5, a large hole 11a is formed at a central portion of the first frame 11 so as to penetrate therethrough in the up-down direction. Further, four rectangular first small holes 11b and five screw holes 11c are formed through the first frame 11 in the up-down direction. The four rectangular first small holes 11b are located at a right end portion of the first frame 11 so as to be arranged in the front-rear direction. Four of the five screw holes 11c are located at respective four corners of the first frame 11, and one of the five screw holes 11c is located at a longitudinally middle of a rear end portion of the first frame 11.

Figure 12:
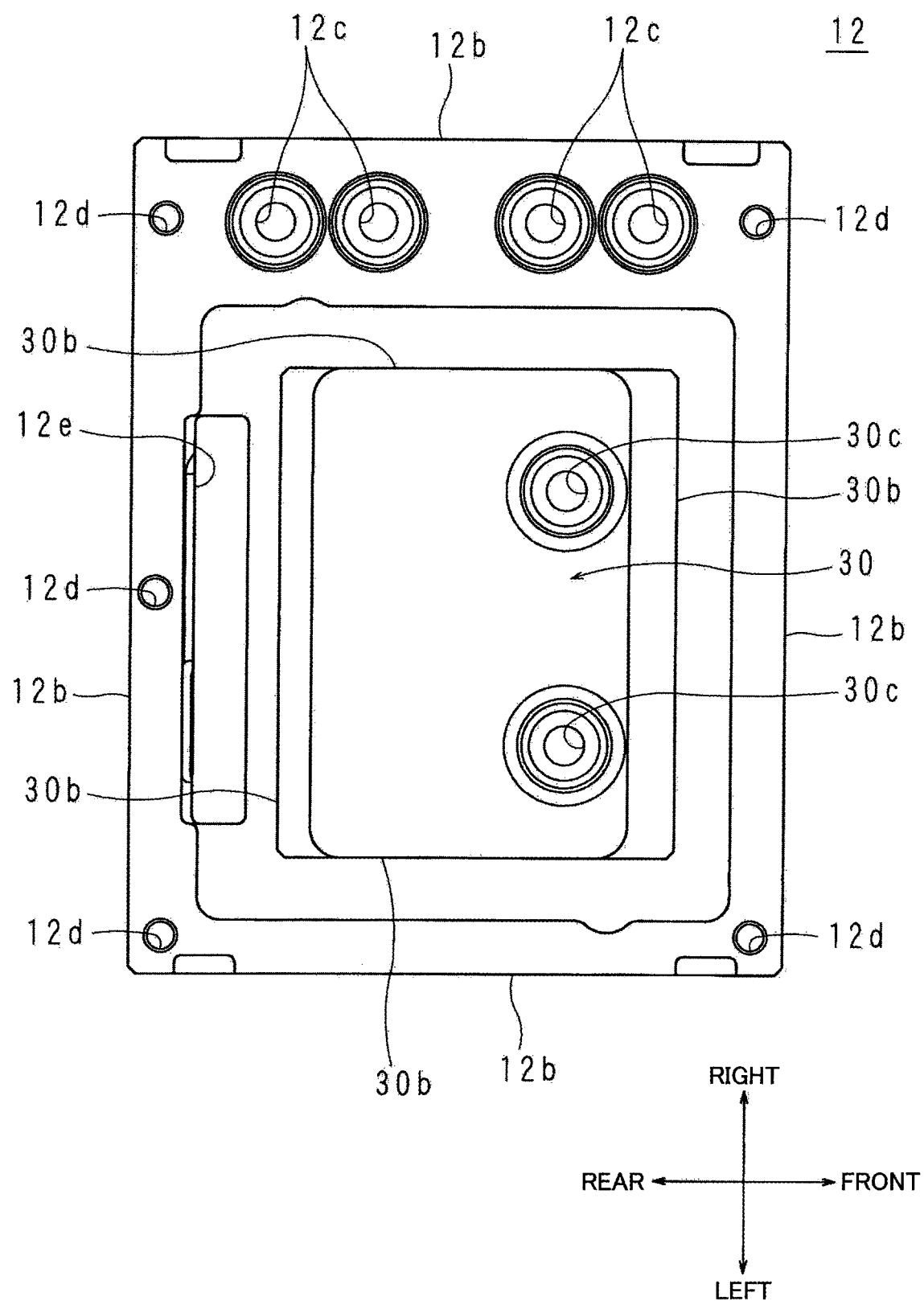
FIG. 12 is a top view of the second frame.
Figure 13:
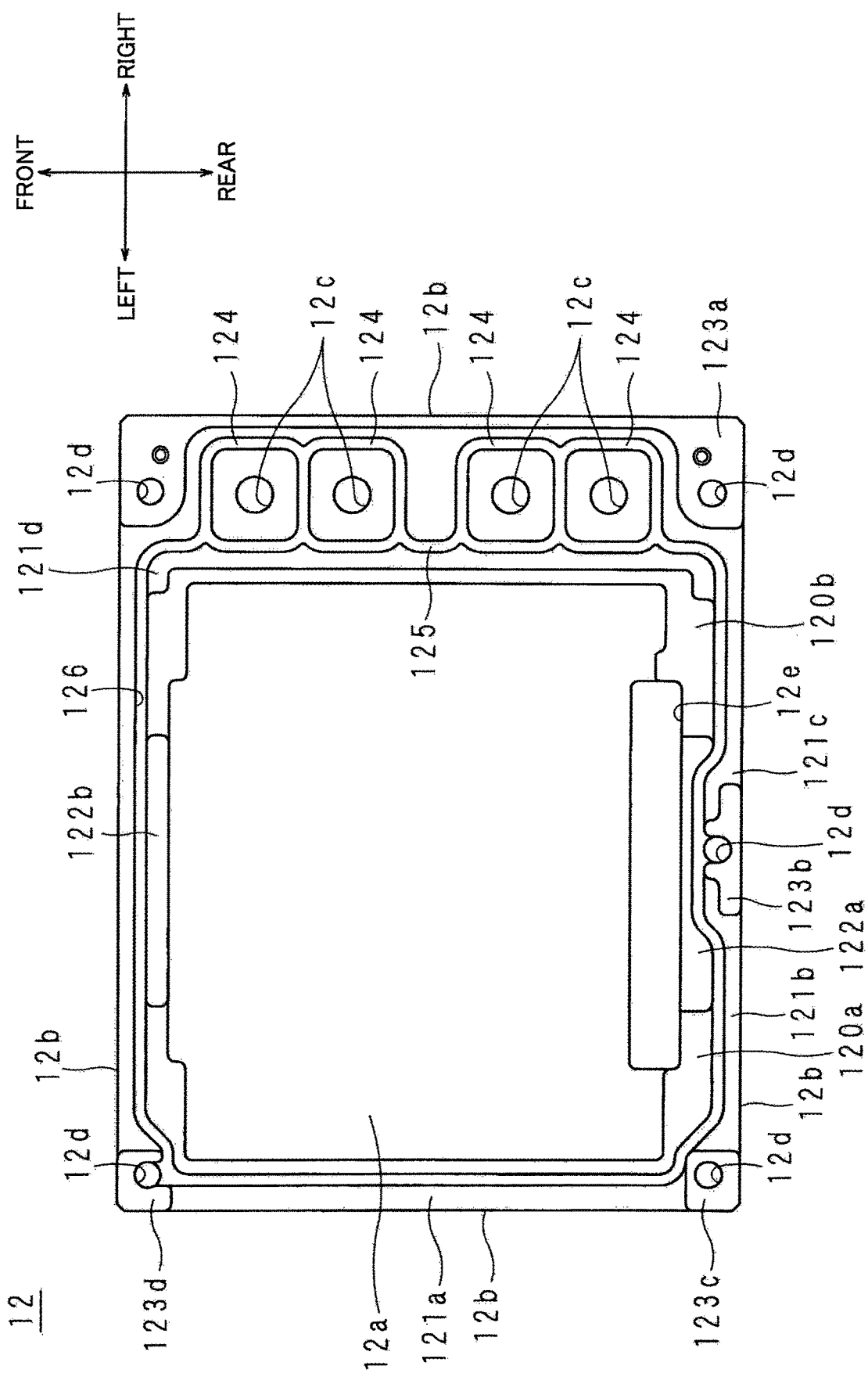
FIG. 13 is a bottom view of the second frame.

As shown in FIG. 5, the second frame 12 is formed of metal. The second frame 12 is shaped like a box which is defined by an upper wall 12a and four side walls 12b and which is open on a lower side. The four side walls 12b are located at respective four sides of the rectangular second frame 12. The four side walls 12b extend or stand in the up-down direction. The upper wall 12a extends, above the four side walls 12b, between mutually facing side walls 12b in the front-rear direction and the right-left direction. The upper wall 12a is orthogonal to the up-down direction and orthogonal to the side walls 12b. The second frame 12 is formed of aluminum, for instance, and functions as a heat spreader for thermal conduction and heat dissipation. The material for the second frame 12 is not limited to aluminum but may be other than aluminum as long as the material has a suitable strength and thermal conductivity. FIGS. 10 and 11 are perspective views of the second frame 12. FIG. 12 is a top view of the second frame 12. FIG. 13 is a bottom view of the second frame 12.

As shown in FIG. 10, four circular second small holes 12c, five circular first screw insertion holes 12d, and one rectangular through-hole 12e are formed through the second frame 12 in the up-down direction. The four circular second small holes 12c are located at a right end portion of the second frame 12 so as to be arranged in the front-rear direction. The second small holes 12c are respectively aligned with the first small holes 11b of the first frame 11 in the up-down direction. Four of the five first screw insertion holes 12d are located at respective four corners of the second frame 12, and one of the five first screw insertion holes 12d is located at a longitudinally middle of the rear end portion of the second frame 12. The first screw insertion holes 12*d* are respectively aligned with the screw holes 11*c* of the first frame 11 in the up-down direction. The rectangular through-hole 12*e* is formed such that its longitudinal direction is along a rear side of the second frame 12. The through-hole 12*e* and the first screw insertion hole 12*d* which is formed at the longitudinally middle of the rear end portion of the second frame 12 are arranged in the front-rear direction, such that the through-hole 12*e* is located forward of the first screw insertion hole 12*d*. The through-hole 12*e* is a hole through which the FPC 16 is inserted.

As shown in FIG. 10, a cooling mechanism 30 is disposed on an upper surface of the upper wall 12*a* of the second frame 12. The cooling mechanism 30 is a container that partially defines a liquid chamber in which a coolant flows. The cooling mechanism 30 includes an upper wall 30*a* and four side walls 30*b*. The cooling mechanism 30 is fixed on the upper wall 12*a* of the second frame 12 such that the four side walls 30*b* are welded to the upper wall 12*a* of the second frame 12. That is, the liquid chamber in the cooling mechanism 30 is defined by the upper wall 30*a*, the four side walls 30*b*, and the upper wall 12*a* of the second frame 12. In terms of welding, the cooling mechanism 30 is formed of the same metal as the second frame 12, such as aluminum. It is noted, however, that the cooling mechanism 30 does not necessarily have to be welded to the second frame 12, but may be bonded to the second frame 12 or may be formed integrally with the second frame 12. In the case where the cooling mechanism 30 is not welded to the second frame 12, the material for the cooling mechanism 30 may be different from the material for the second frame 12. The upper wall 30*a* of the cooling mechanism 30 has a rectangular shape which is smaller than the upper wall 12*a* and whose four sides are substantially parallel to four sides of the upper wall 12*a* of the second frame 12. Two openings 30*c* are formed near a front end portion of the upper wall 30*a* of the cooling mechanism 30 so as to be arranged in the right-left direction. The two openings 30*c* respectively function as an inlet and an outlet through which the coolant flows in and out of the liquid chamber in the cooling mechanism 30.

Figure 14:
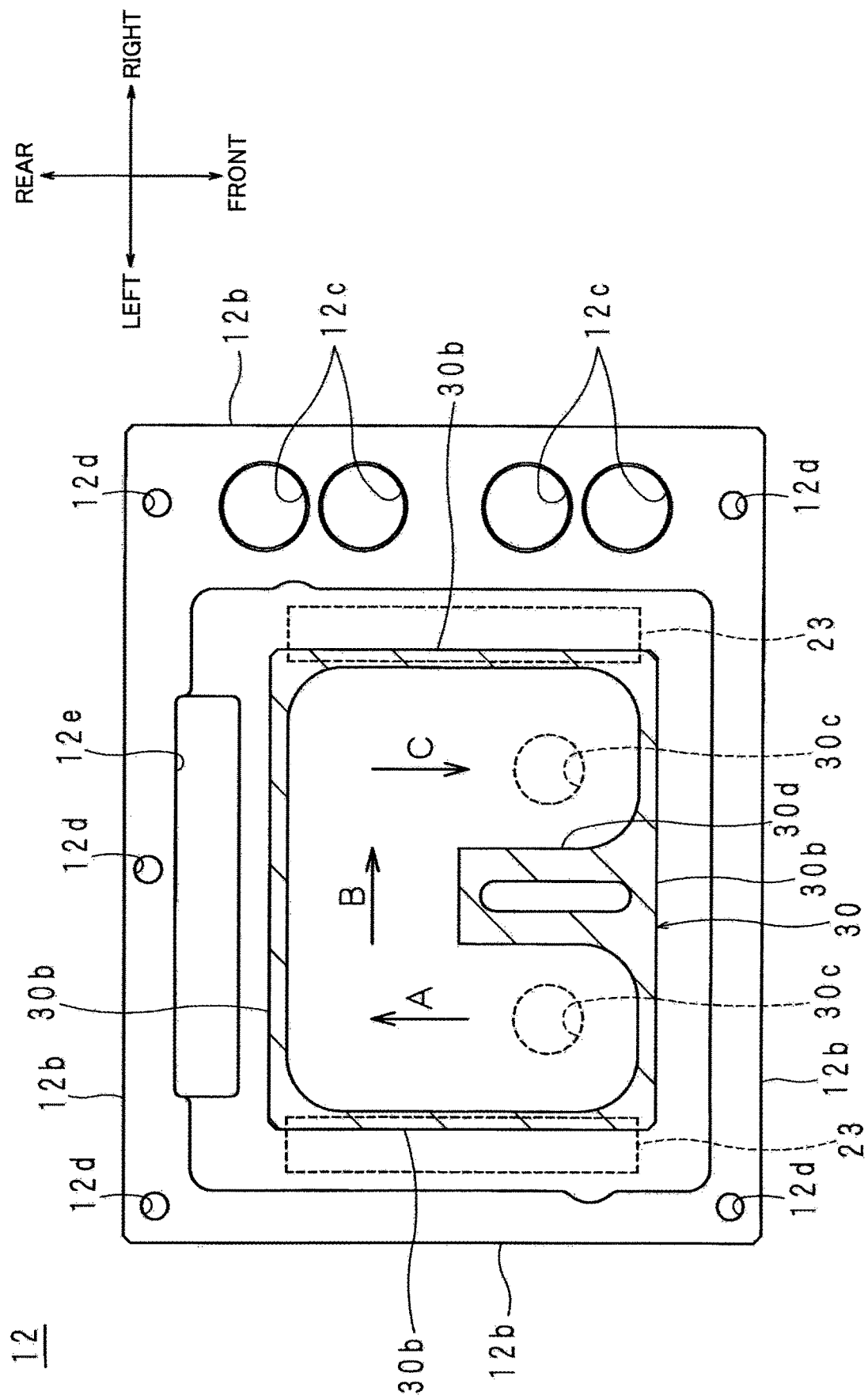
FIG. 14 is a schematic cross-sectional view for explaining a structure of a cooling mechanism.

FIG. 14 is a schematic cross-sectional view for explaining a structure of the cooling mechanism 30. In the cooling mechanism 30 disposed on the upper surface of the upper wall 12*a* of the second frame 12, there is formed a space enclosed with the upper wall 30*a*, the four side walls 30*b*, and the upper wall 12*a* of the second frame 12. This space is the liquid chamber indicated above in which the coolant flows. The liquid chamber is partitioned by a rib 30*d* at a portion of the liquid chamber extending from its central portion in the front-rear and the right-left directions to the front side wall 30*b*. In other words, the rib 30*d* extends in the front-rear direction from the front side wall 30*b* toward the central portion of the liquid chamber. A lower surface of the rib 30*d* is in contact with the upper wall 12*a*. The rib 30*d* is located between the two openings 30, in the right-left direction, formed in the upper wall 30*a*. Thus, the liquid chamber having a U shape in top view is formed in the cooling mechanism 30. For instance, in FIG. 14, the coolant that flows into the liquid chamber through the left opening 30*c* flows in a direction indicated by an arrow A along the left side wall 30*b*, subsequently flows in a direction indicated by an arrow B along the rear side wall 30*b*, then flows in a direction indicated by an arrow C along the right side wall 30*b*, and finally flows out of the liquid chamber through the right opening 30*c*.

Though not explained in detail, the two driver ICs 23 disposed on the COF 20 contact a lower surface the upper wall 12*a* of the second frame 12. That is, at least a part of the region of the lower surface of the upper wall 12*a* is held in contact with the upper surfaces of the two driver ICs 23. The state in which at least a part of the region of the second frame 12 is held in contact with the two driver ICs 23 is one example of a thermally connected state of the upper wall 12*a* to the two driver ICs 23. In FIG. 14, positions of the two driver ICs 23 are indicated in the dashed line. Each driver IC 23 has a rectangular shape in top view. The driver ICs 23 are disposed below the upper wall 12*a* of the second frame 12 such that a longitudinal direction of the driver ICs 23 coincides with the front-rear direction. The two driver ICs 23 are arranged in the right-left direction, and the cooling mechanism 30 is located between the two driver ICs 23. The two driver ICs 23 are preferably located below the cooling mechanism 30. In this arrangement, the coolant that flows in the liquid chamber through the left opening 30*c* flows in the direction indicated by the arrow A along the left driver IC 23, subsequently flows in the direction indicated by the arrow B along the rear side wall 30*b*, then flows in the direction indicated by the arrow C along the right driver IC 23, and finally flows out of the liquid chamber through the right opening 30*c*.

As shown in FIG. 13, the lower surface of the second frame 12 includes two flat surfaces 120 (120*a*, 120*b*), four flat surfaces 121 (121*a*-121*d*), two flat surfaces 122 (122*a*, 122*b*), and four flat surfaces 123 (123*a*-123*d*).

The flat surfaces 120 are formed at inner edge portions of lower ends of the four side walls 12*b*. The flat surface 120*a* is located so as to correspond to the left side wall 12*b*, a left portion of the front side wall 12*b*, and a left portion of the rear side wall 12*b*. The flat surface 120*a* includes: a front portion located at a rear edge of the front side wall 12*b*; a rear portion located at a front edge of the rear side wall 12*b*; and a left portion located at a right edge of the left side wall 12*b* and connecting the front portion and the rear portion. The front portion and the rear portion of the flat surface 120*a* have a larger width than the left portion thereof. Similarly, the flat surface 120*b* is located so as to correspond to the right side wall 12*b*, a right portion of the front side wall 12*b*, and a right portion of the rear side wall 12*b*. The flat surface 120*b* includes: a front portion located at the rear edge of the front side wall 12*b*; a rear portion located at the front edge of the rear side wall 12*b*; and a right portion located at a left edge of the right side wall 12*b* and connecting the front portion and the rear portion. The front portion and the rear portion of the flat surface 120*b* have a larger width than the right portion thereof.

The flat surfaces 122 are respectively formed at the inner edge portion of the lower end of the front side wall 12*b* and the inner edge portion of the lower end of the rear side wall 12*b*. The flat surface 122*a* is located at a central portion of the rear side wall 12*b*. The flat surface 122*a* is elongated in the right-left direction. The flat surface 122*a* is formed along the front edge of the rear side wall 12*b* and located between the rear portion of the flat surface 120*a* and the rear portion of the flat surface 120*b*. Similarly, the flat surface 122*b* is located at a central portion of the front side wall 12*b*. The flat surface 122*b* is elongated in the right-left direction. The flat surface 122*b* is formed along the rear edge of the front side wall 12*b* and located between the front portion of the flat surface 120*a* and the front portion of the flat surface 120*b*. The flat surfaces 122*a*, 122*b* are located at a height level lower than the flat surfaces 120*a*, 120*b* in the up-down direction.

The four flat surfaces 123a-123d are located at a height level lower than the flat surfaces 120a, 120b and at a height level lower than the flat surfaces 122a, 122b. The flat surfaces 123a-123d are in contact with the upper surface of the first frame 11. In a state in which the flat surfaces 123a-123d are in contact with the upper surface of the first frame 11, the flat surfaces 120a, 120b and the upper surface of the first frame 11 do not contact each other, and a clearance is formed therebetween. The first screw insertion holes 12d described above are located so as to surround first grooves 124, a second groove 125, and a third groove 126 (which will be explained). The four flat surfaces 123a-123d of the second frame 12 are formed corresponding to the first screw insertion holes 12d.

The flat surface 123a is elongated in the front-rear direction. The flat surface 123a is formed along an outer edge of the lower surface of the right side wall 12b of the second frame 12. A front end portion of the flat surface 123a encloses the first screw insertion hole 12d formed at a front right portion of the second frame 12, and a rear end portion of the flat surface 123a encloses the first screw insertion hole 12d formed at a rear right portion of the second frame 12. The flat surface 123b is elongated in the right-left direction. The flat surface 123b is formed along an outer edge of the lower surface of the rear side wall 12b of the second frame 12, so as to be located at a central portion in the right-left direction. The flat surface 123b encloses the corresponding first screw insertion hole 12d from behind. The flat surface 123c is located at a rear left end portion of the lower surface of the second frame 12, so as to enclose the corresponding first screw insertion hole 12d. The flat surface 123d is located at a front left end portion of the lower surface of the second frame 12, so as to enclose the corresponding first screw insertion hole 12d from a front left side.

The flat surface 121a is formed along an outer edge of the lower surface of the left side wall 12b of the second frame 12, so as to be located between the flat surface 123c and the flat surface 123d. The flat surface 121a is contiguous to an outer surface of the second frame 12. The flat surface 121b is formed along the outer edge of the lower surface of the rear side wall 12b, so as to be located between the flat surface 123b and the flat surface 123c. The flat surface 121c includes: a rear portion formed along the outer edge of the lower surface of the rear side wall 12b so as to be located between the flat surface 123a and the flat surface 123b; a right portion formed at the right side wall 12b so as to extend in the front-rear direction along the flat surface 123a; and a front portion formed along an outer edge of the lower surface of the front side wall 12b so as to be located between the flat surface 123a and the flat surface 123d. The rear portion, the right portion, and the front portion of the flat surface 121c are contiguous to each other. The flat surface 121d is located to the right of the flat surface 120b and is contiguous to the flat surface 120b. The four flat surfaces 121 are located at a height level higher than the two flat surfaces 120 in the up-down direction.

Four first grooves 124, each shaped like a rectangular loop, are formed between the flat surface 121c and the flat surface 121d at the right end portion of the second frame 12, such that each first groove 124 surrounds a corresponding one of the second small holes 12c. A rear side portion of the frontmost first groove 124 is contiguous to a front side portion of the first groove 124 next to the frontmost first groove 124. A front side portion of the rearmost first groove 124 is contiguous to a rear side portion of the first groove 124 next to the rearmost first groove 124. Intermediate two of the four first grooves 124 are connected by a second groove 125 that is connected to a left end of a rear side portion of a front one of the two intermediate first grooves 124 and a left end of a front side portion of a rear one of the two intermediate first grooves 124.

A front side portion of the frontmost first groove 124 and a rear side portion of the rearmost first groove 124 are connected by the third groove 126. The third groove 126 extends along the front side, the left side, and the rear side of the rectangular second frame 12, so as to surround the flat surfaces 120a, 120b of the second frame 12. Thus, the first grooves 124, the second groove 125, and the third groove 126 surround, as a whole, the flat surfaces 120a, 120b and the flat surfaces 122a, 122b. As described above, the second frame 12 is shaped like a box which is defined by the upper wall 12a and the four side walls 12b and which is open on its lower side. The lower side of the box-like second frame 12 is a rectangular opening. In other words, the first grooves 124, the second groove 125, and the third groove 126 are formed in the second frame 12 so as to surround the opening of the second frame 12 as a whole. It is noted that a bottom surface of each first groove 124, a bottom surface of the second groove 125, and a bottom surface of the third groove 126 are located at a height level higher than the four flat surfaces 121 in the up-down direction.

The flat surfaces 123a-123d are in contact with the upper surface of the first frame 11. The flat surfaces 123a-123d keep a distance between the flat surfaces 120a, 120b and the first frame 11 in the up-down direction.

The gasket 14 is fitted in the first grooves 124, the second groove 125, and the third groove 126. That is, the gasket 14 is positioned in the first grooves 124, the second groove 125, and the third groove 126. The gasket 14 is formed of a rubber, for instance. The flat surfaces 120a, 120b, 122a, 122b are surrounded by the first grooves 124, the second groove 125, the third groove 126, and the gasket 14. The gasket 14 contacts the first frame 11 in the up-down direction, so as to seal between the first frame 11 and the second frame 12. It is thus possible to prevent entry of foreign substances such as the ink into between the first frame 11 and the second frame 12.

As shown in FIG. 5, the holder 13 is formed of stainless steel or the like and has an elongated shape in the right-left direction. A rectangular large hole 13a is formed through a central portion of the holder 13 in the up-down direction. Further, two third small holes 13b and five second screw insertion holes 13c are formed through the holder 13 in the up-down direction. The two third small holes 13b have an oblong shape elongated in the front-rear direction and are formed at a right end portion of the holder 13 so as to be arranged in the front-rear direction. Four of the five second screw insertion holes 13c are respectively located at four corners of the holder 13, and one of the five second screw insertion holes 13c is located at a longitudinally middle of the rear end portion of the holder 13. The second screw insertion holes 13c are respectively aligned with the screw holes 11c of the first frame 11 and the first screw insertion holes 12d of the second frame 12 in the up-down direction. The holder 13 is mounted on the upper surface of the second frame 12 and is fixed to the support plate 7 (FIG. 2) so as to be supported by the support plate 7.

A front one of the two third small holes 13b of the holder 13 is located so as to be aligned with front two of the four second small holes 12c of the second frame 12 in the up-down direction. A rear one of the two third small holes 13b of the holder 13 is located so as to be aligned with rear two of the four second small holes 12c of the second frame 12. Into the four second small holes 12c of the second frame 12, pipes (not shown) for supplying the ink are respectively fitted. The pipes protrude upward through the third small holes 13b of the holder 13 and fluidically communicate with the reservoir of the printer 100 via tubes attached to upper end portions of the pipes. The ink in the reservoir is supplied, via the pipes, from the first small holes 11b connected to the second small holes 12c to the channel structure 15 connected to the first small holes 11b. The ink in the channel structure 15 is returned from the first small holes 11b to the reservoir via the pipes.

As shown in FIG. 8, the first frame 11, the second frame 12, and the holder 13 are fixed to each other by five screws 13d. Each screw 13d is inserted into a corresponding one of the second screw insertion holes 13c of the holder 13 and a corresponding one of the first screw insertion holes 12d of the second frame 12, so as to be screwed into a corresponding one of the screw holes 11c of the first frame 11.

In a state in which the holder 13 is fixed to the second frame 12, the cooling mechanism 30 disposed on the second frame 12 protrudes upward through the large hole 13a of the holder 13. The large hole 13a of the holder 13 communicates with the through-hole 12e formed at the rear end portion of the second frame 12.

The channel structure 15 is constituted by a plurality of metal plates stacked on each other in the up-down direction. The direction in which the plurality of metal plates are stacked, i.e., a stacking direction, is parallel to the up-down direction. The stacking direction of the metal plates of the channel structure 15 coincides with a stacking direction of the channel structure 15, the first frame 11, the second frame 12, and the holder 13 in the head module 10. The upper wall 12a of the second frame 12 extends in a direction orthogonal to the stacking direction.

Figure 15:
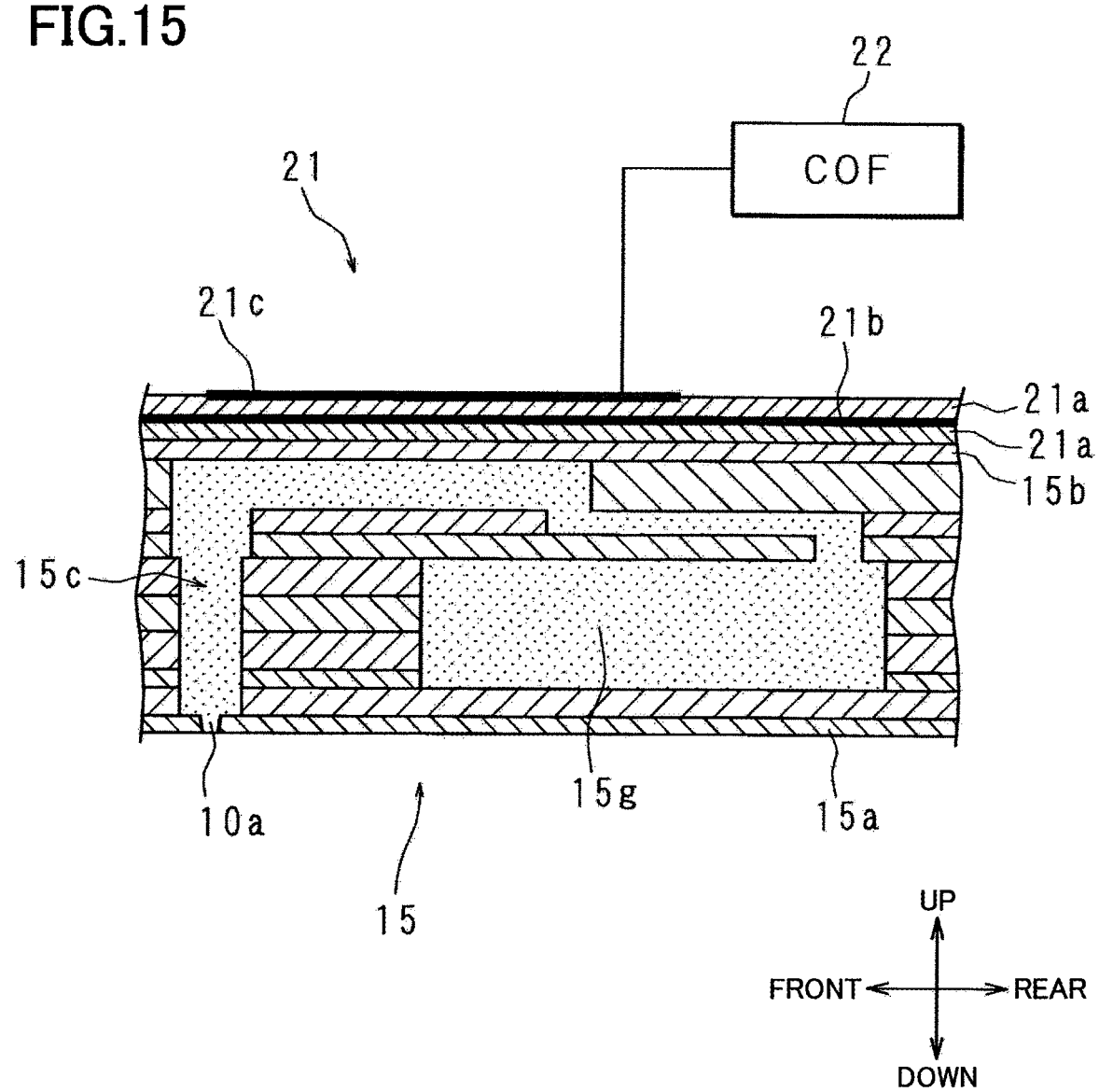
FIG. 15 is a cross-sectional view schematically showing a structure of a channel structure.
Figure 16:
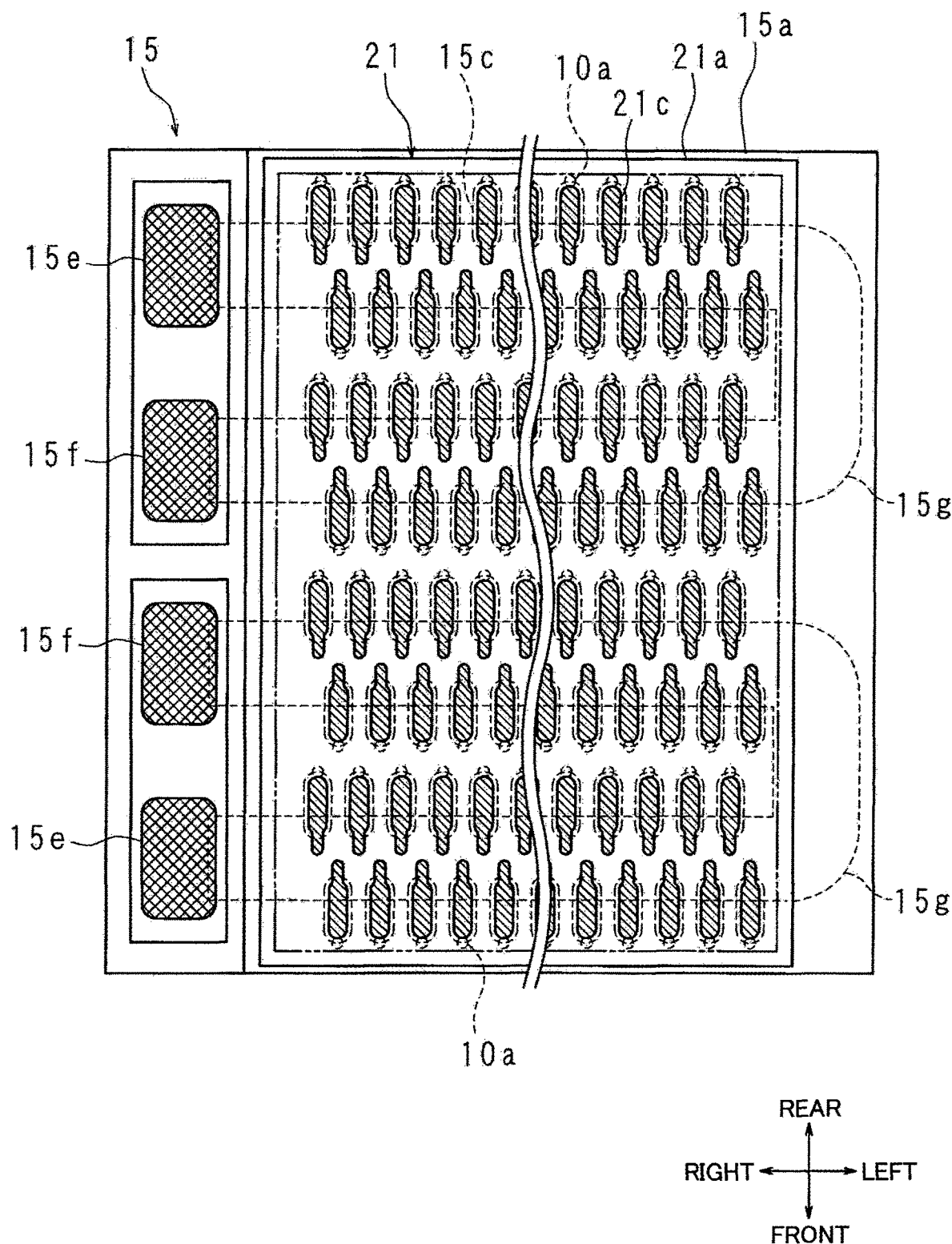
FIG. 16 is a plan view showing an upper surface of the channel structure.

FIG. 15 is a cross-sectional view schematically showing the structure of the channel structure 15. FIG. 16 is a plan view showing an upper surface of the channel structure 15. The channel structure 15 is a rectangular plate elongated in the right-left direction. The channel structure 15 is fixed at its upper surface to the lower surface of the first frame 11 by an adhesive. The channel structure 15 includes a nozzle plate 15a and a vibration plate 15b. The plurality of ejection openings 10a are formed in the nozzle plate 15a so as to be arranged in the right-left direction, i.e., a direction perpendicular to the sheet surface of FIG. 15. Pressure chambers 15c are formed above the respective ejection openings 10a. The pressure chambers 15c fluidially communicate with common channels 15g which will be explained. The vibration plate 15b is disposed above the pressure chambers 15c and defines upper portions of the pressure chambers 15c. In the thus constructed channel structure 15, the ink is ejected from the ejection openings 10a by energization of an actuator.

The channel structure 15 includes two supply openings 15e through which the liquid is supplied. The two supply openings 15e are formed at a right edge portion of the channel structure 15 so as to be arranged in the front-rear direction. At the right edge portion of the channel structure 15, two discharge openings 15f through which the liquid is discharged are formed between the two supply openings 15e so as to be arranged in the front-rear direction. One of the two supply openings 15e and one of the two discharge openings 15f adjacent to this supply opening 15e are connected to each other by a common channel 15g having a U-shape in plan view. The common channel 15g is formed in the channel structure 15 and connected to the corresponding pressure chambers 15c. The common channel 15g is connected to the corresponding first small holes 11b of the first frame 11 via the supply opening 15e and the discharge opening 15f. The ink supplied from the ink tank to the supply opening 15e via the pipe and the first small hole 11b, etc., reaches the pressure chambers 15c via the common channel 15g. The other of the two supply openings 15e and the other of the two discharge openings 15f adjacent to this supply opening 15e are connected to each other by another common channel 15g having a U-shape in plan view. The common channel 15g is formed in the channel structure 15 and is connected to the corresponding pressure chambers 15c.

As shown in FIG. 8, the COF 20 is disposed in a space enclosed with the first frame 11, the second frame 12, and the channel structure 15. An actuator 21 is superposed on the upper surface of the channel structure 15 in the large hole 11a of the first frame 11. That is, in the head module 10, the channel structure 15, the actuator 21, the first frame 11, the second frame 12, and the holder 13 constitute a stacking structure, and the up-down direction coincides with the stacking direction. The upper wall 12a of the second frame 12 extends in a direction orthogonal to the stacking direction.

As shown in FIG. 15, the actuator 21 is disposed on the vibration plate 15b of the channel structure 15. Two piezoelectric layers 21a are superposed on the actuator 21, and a common electrode 21b is provided between the two piezoelectric layers 21a. The common electrode 21b is always kept at a ground potential. The actuator 21 includes a plurality of individual electrodes 21c arranged in the right-left direction. The individual electrodes 21c are formed on an upper one of the two piezoelectric layers 21a so as to be located over the respective pressure chambers 15c. The plurality of individual electrodes 21c are connected to the COF 20.

As shown in FIG. 8, the COF 20 is a sheet having flexibility and includes a mounted portion 20a and a pair of bent portions 20b. The mounted portion 20a is mounted on and bonded to the upper surface of the actuator 21 via a bonding member. The bonding member may be a double-sided tape, a sheet-like adhesive or the like. The mounted portion 20a includes a plurality of contacts. There are formed, on the upper surface of the actuator 21, a plurality of contacts corresponding to the plurality of individual electrodes 21c and a plurality of contacts corresponding to the common electrode 21b. The contacts of the mounted portion 20a are electrically connected, by bumps, to the contacts of the individual electrodes 21c formed on the upper surface of the actuator 21.

The pair of bent portions 20b are portions of the COF 20 that extend upward at opposite ends of the mounted portion 20a and bent in directions in which the pair of bent portions 20b get closer to each other. The bent portions 20b are opposed to the upper surface of the actuator 21. The driver ICs 23 are respectively disposed on upper surfaces of the respective bent portions 20b.

As shown in FIG. 8, the FPC 16 includes a lower plate portion 16a and an extending portion 16b. The extending portion 16b extends upward from one surface of the lower plate portion 16a and is electrically connected to the controller 5 (FIG. 1). A plurality of circuit components such as connectors are mounted on a lower surface of the lower plate portion 16a. The extending portion 16b extends outside the head module 10 through the rectangular through-hole 12e formed in the upper wall 12a of the second frame 12 and the large hole 13a of the holder 13, so as to be electrically connected to the controller 5.

The pair of bent portions 20b of the COF 20 are connected at distal end portions thereof to the lower plate portion 16a of the FPC 16. A plurality of contacts (not shown) are formed on an upper surface of the lower plate portion 16a. A plurality of contacts are formed at the distal end portions of the pair of bent portions 20b corresponding to the plurality of contacts of the lower plate portion 16a. The contacts of the lower plate portion 16a are electrically connected to the contacts of the bent portions 20b.

A control signal from the controller 5 is input to the driver ICs 23 via the FPC 16 and the COF 20. Each driver IC 23 generates a drive signal based on the control signal and outputs the drive signal to the actuator 21.

As shown in FIG. 8, the head module 10 further includes a pressing member 24 and a biasing member 25. The pressing member 24 is shaped like a rectangular plate. The pressing member 24 is disposed on an upper surface of the mounted portion 20a of the COF 20, and a leg portion of the pressing member 24 that protrudes from its lower surface is located on the periphery of the mounted portion 20a. The mounted portion 20a is located between the pressing member 24 and the actuator 21. Two protrusions 24a are formed on an upper surface of the pressing member 24. The pressing member 24 prevents the mounted portion 20a from separating away from the actuator 21.

FIG. 17 is a perspective view of the biasing member 25. The biasing member 25 is an elastic member formed of metal or the like and having a spring property. The biasing member 25 includes a rectangular flat plate portion 25a elongated in the right-left direction, four flat small plate portions 25b respectively extending from four corners of the flat plate portion 25a, and four elastic portions 25c extending obliquely upward from the respective small plate portions 25b. The flat plate portion 25a, the small plate portions 25b, and the elastic portions 25c are formed by one plate.

Two holes 25d, 25e are respectively formed at a front side and a rear side of the flat plate portion 25a through the thickness of the flat plate portion 25a, namely, the two holes 25d, 25e extend through the flat plate portion 25a in its thickness direction (the up-down direction). The hole 25d is a circular hole, and the hole 25e is an elongate hole longer than the hole 25d in the front-rear direction. The small plate portions 25b extend from the respective four corners of the flat plate portion 25a in the right-left direction. The elastic portions 25c extend from the respective small plate portions 25b obliquely upward toward a central portion in the front-rear direction. Each elastic portion 25c is formed by being bent relative to the flat plate portion 25a. A distal end of each elastic portion 25c is bent downward. The front side and the rear side of the flat plate portion 25a of the biasing member 25 are recessed toward the central portion, so that two recesses 25f are formed.

As shown in FIG. 8, the biasing member 25 is disposed between the lower plate portion 16a of the FPC 16 and the pressing member 24 with the elastic portions 25c directed toward the bent portions 20b of the COF 20. The small plate portions 25b of the biasing member 25 are nipped by the upper surface of the first frame 11 and the lower surface of the second frame 12. The small plate portions 25b of the biasing member 25 are disposed at the large-width portions of the respective flat surfaces 120a, 120b of the lower surface of the second frame 12. Thus, the flat surfaces 120a, 120b of the second frame 12 surround the periphery of the biasing member 25, so that the biasing member 25 is positioned and fixed relative to the up-down direction. The two of the four small plate portions 25b of the biasing member 25 arranged in the right-left direction sandwich portions of the flat surface 122a of the second frame 12 that are contiguous to the flat surfaces 120a, 120b, and another two of the four small plate portions 25b of the biasing member 25 arranged in the right-left direction sandwich portions of the flat surface 122b of the second frame 12 that are contiguous to the flat surfaces 120a, 120b. This arrangement limits a movement of the biasing member 25 in the right-left direction.

The two protrusions 24a of the pressing member 24 are inserted through the holes 25d, 25e of the biasing member 25. This arrangement prevents positional misalignment of the biasing member 25 with respect to the pressing member 24 in the front-rear and right-left directions. Further, the elongate hole 25e absorbs an error of a position of the biasing member 25 in the front-rear direction. The biasing member 25 is disposed such that the recesses 25f are located at positions corresponding to the circuit components of the lower plate portion 16a of the FPC 16, thereby preventing the biasing member 25 and the circuit components of the FPC 16 from interfering with each other.

The lower plate portion 16a of the FPC 16 is disposed so as to be sandwiched between the bent portions 20b of the COF 20 and the biasing member 25. Further, the bent portions of the respective elastic portions 25c of the biasing member 25 are in contact with the lower surface of the lower plate portion 16a of the FPC 16 and push up the lower plate portion 16a owing to the elasticity of the elastic portions 25c at basal ends thereof. In a state in which the biasing member 25 is sandwiched by the first frame 11 and the second frame 12 and fixed at a predetermined position, the elastic portions 25c of the biasing member 25 are located below the driver ICs 23 of the COF 20. Thus, the elastic portions 25c bias the driver ICs 23 upward, namely, in a direction in which the driver ICs 23 approach the upper wall 12a of the second frame 12, via the lower plate portion 16a of the FPC 16. The driver ICs 23 are biased by the biasing member 25 toward the upper wall 12a of the second frame 12 and are pushed onto the lower surface of the upper wall 12a. That is, the driver ICs 23 are thermally connected to the upper wall 12a of the second frame 12. Thus, heat generated by the driver ICs 23 is transferred to the cooling mechanism 30 via the upper wall 12a of the second frame 12 functioning as a heat spreader. The small plate portions 25b of the biasing member 25 are fixed by the first frame 11 and the second frame 12, so that a counterforce of the biasing member 25 is received by the first frame 11.

In the present embodiment, the driver ICs 23 contact the upper wall 12a of the second frame 12, and the driver ICs 23 and the upper wall 12a of the second frame 12 are thermally connected. The thermal connection is not limited to a direct contact of the driver ICs 23 and the upper wall 12a. For instance, heat-conductive grease or the like may be applied between the driver ICs 23 and the upper wall 12a of the second frame 12. In other words, the driver ICs 23 and the upper wall 12a of the second frame 12 may be thermally connected via a substance that transfers heat. It is noted, however, that a state in which the driver ICs 23 and the upper wall 12a of the second frame 12 are merely close or adjacent to each other without contacting, namely, a state in which only air exists between the driver ICs 23 and the upper wall 12a of the second frame 12, is not regarded as the state in which the driver ICs 23 and the upper wall 12a of the second frame 12 are thermally connected.

Figure 18:
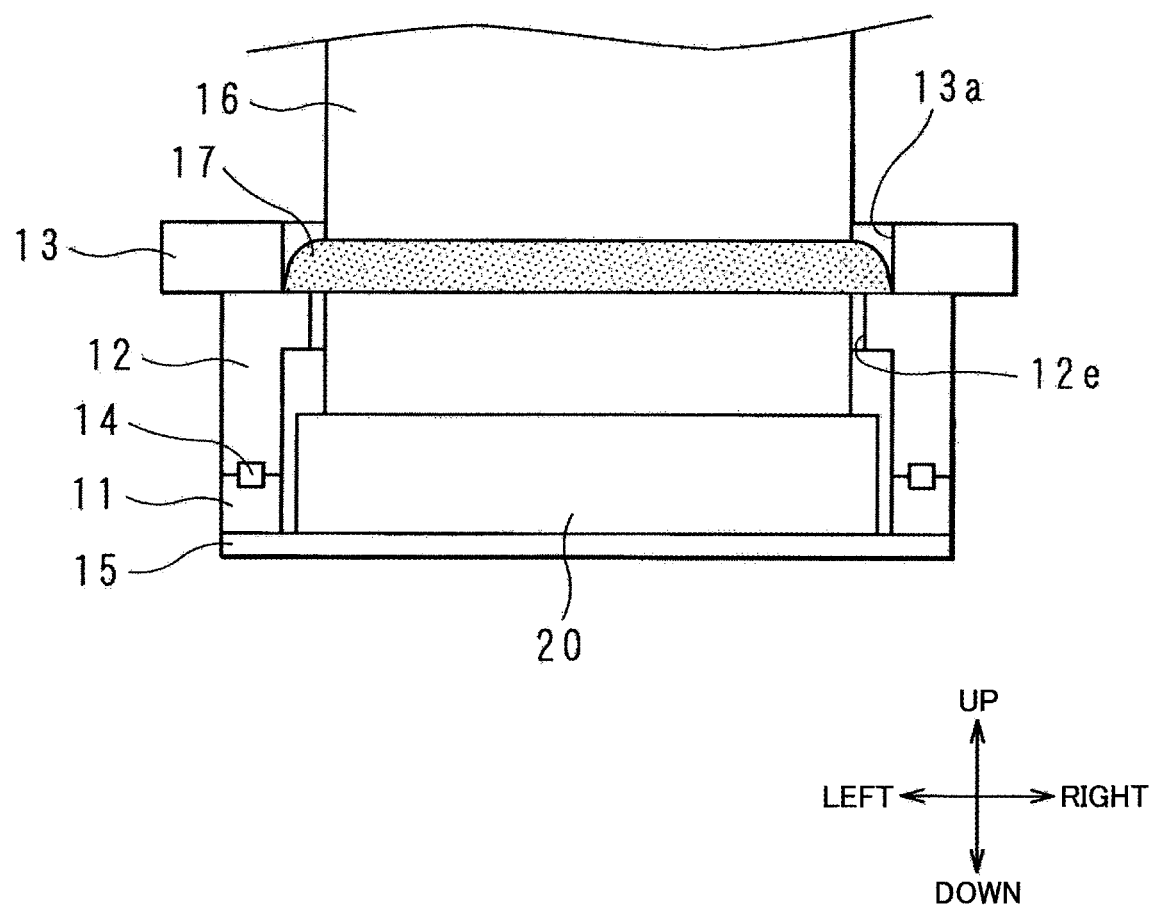
FIG. 18 is a schematic cross-sectional view for explaining a closure member that closes a through-hole of the second frame.

The FPC 16 is electrically connected at the lower plate portion 16a to the COF 20 located in the space enclosed with the first frame 11, the second frame 12, and the channel structure 15. The extending portion 16b of the FPC 16 connected to the COF 20 extends outside the space indicated above through the through-hole 12e of the second frame 12 and the large hole 13a of the holder 13. The head module 10 includes a closure member for closing the through-hole 12e through which the extending portion 16b of the FPC 16 is inserted. FIG. 18 is a schematic cross-sectional view for explaining the closure member for closing the through-hole 12e of the second frame 12. In the example illustrated in FIG. 18, a resin 17 is applied (by the so-called potting) to the upper wall 12a of the second frame 12, so as to close the through-hole 12e through which the extending portion 16b of the FPC 16 is inserted. It is noted that the through-hole 12e may be closed by any method other than the potting. For instance, the through-hole 12e may be closed by a lid that covers the through-hole 12e or a fitting member that is inserted in the through-hole 12e. The space enclosed with the first frame 11, the second frame, and the channel structure 15 is isolated from an exterior by closing the through-hole 12e, making it possible to prevent entry of the ink or foreign substances into the head module 10.

When the printer 100 constructed as described above accepts an instruction to operate from an external apparatus or from an operation panel of the printer 100, the programs stored in the ROM are executed and the following operations are performed. The controller 5 causes the two rollers 4, 4 to operate so as to convey the recording sheet 101 on the platen 2. Further, the controller 5 transmits the control signal to the driver ICs 23 of the COF 20 via the FPC 16, and the driver ICs 23 receive the control signal.

The driver ICs 23 output, to the actuator 21, the drive signal generated based on the received control signal. As a result, a voltage is applied between the common electrode 21b and the individual electrodes 21c, and the piezoelectric layers 21a are driven so as to vibrate the vibration plate 15b. The vibration of the vibration plate 15b causes the pressure in the pressure chambers 15c to become positive, and the ink is ejected from the ejection openings 10a. Further, the vibration of the vibration plate 15b causes the pressure in the pressure chambers 15c to become negative, and the ink is supplied to the pressure chambers 15c from the common channels 15g.

The ink having not been supplied to the pressure chambers 15c flows through the common channel 15g along a front edge portion or a rear edge portion of the channel structure 15, makes a U-turn at a left edge portion of the channel structure 15, flows rightward at a central portion of the channel structure 15 in the front-rear direction, and reaches the discharge opening 15f. The ink discharged from the discharge opening 15f returns to the ink tank via the pipe, etc., and is again supplied to the supply opening 15e.

The controller 5 causes a pressure change in the channel structure 15 of each head module 10 of the respective ink-jet heads 3, such that a predetermined amount of the ink of each color is ejected. Thus, a desired image is printed on the recording sheet 101 passing under the ink-jet heads 3.

The operations of the printer 100 described above may cause the two driver ICs 23 connected to the COF 20 to generate heat. In the head module 10, the two driver ICs 23 are pressed onto the upper wall 12a of the second frame 12 by the biasing member 25. The second frame 12 is formed of metal, such as aluminum, having high thermal conductivity, and the upper wall 12a of the second frame 12 functions as the heat spreader. Thus, the heat of the driver ICs 23 which are pressed onto the upper wall 12a of the second frame 12 is transferred to the upper wall 12a and to the cooling mechanism 30, so that the cooling mechanism 30 cools the driver ICs 23.

Further, the operations of the printer 100 described above may cause the actuator 21 to generate heat. In this case, the temperature of the channel structure 15 becomes high. In the head module 10 according to the present embodiment, the channel structure 15 is fixed to the first frame 11, and the first frame 11 is fixed to the side walls 12b of the second frame 12. The first frame 11 is formed of metal, such as stainless steel, having high thermal conductivity. Thus, the heat of the channel structure 15 is transferred to the first frame 11, then to the second frame 12, and reaches the cooling mechanism 30, so that the cooling mechanism 30 cools the channel structure 15.

Figure 19:
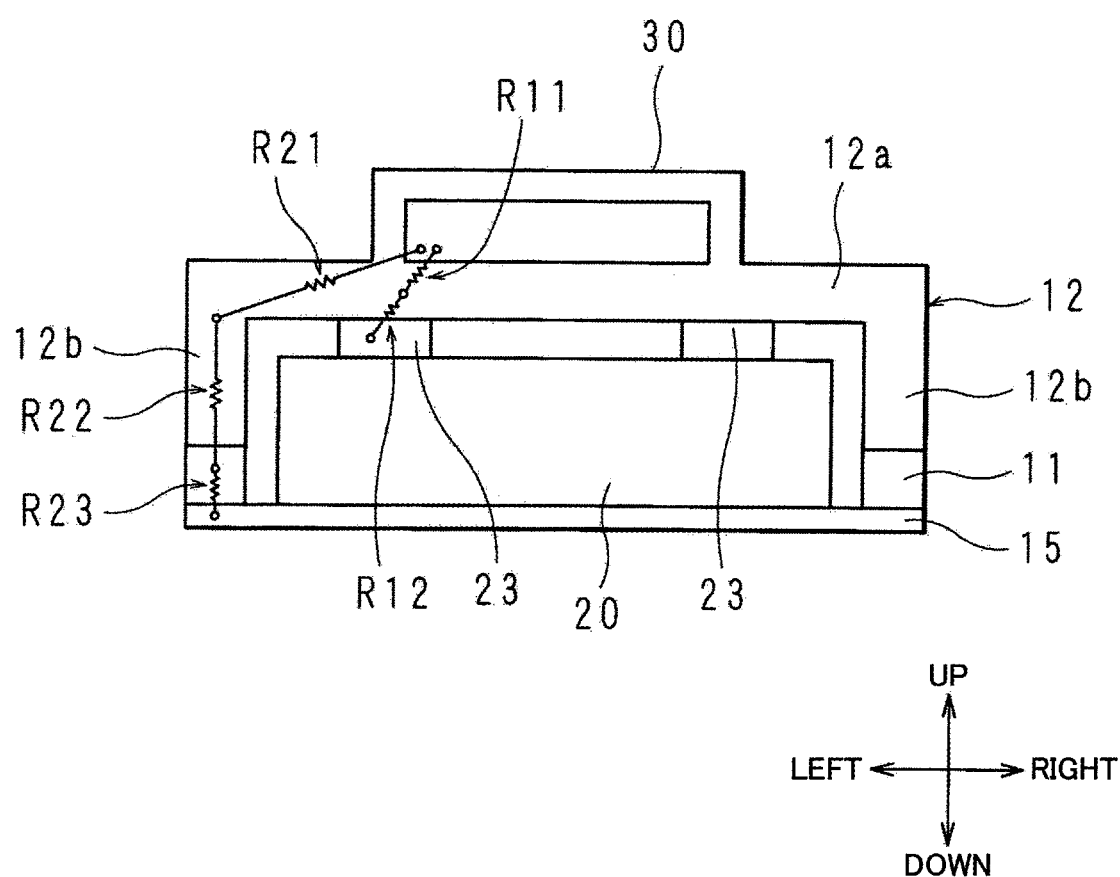
FIG. 19 is a schematic view for explaining thermal resistances in the head module.

FIG. 19 is a schematic view for explaining thermal resistances in the head module 10. The thermal resistance [K/W] is a value indicative of difficulty of transferring heat and is determined based on thermal conductivity [W/(m²K)] of an object that transfers heat and an area [m²] of the object. As illustrated, a thermal resistance from the cooling mechanism 30 having the liquid chamber that stores the coolant to the upper wall 12a of the second frame 12 is defined as R11, and a thermal resistance from the upper wall 12a of the second frame 12 to the driver IC 23 is defined as R12. Further, a thermal resistance from the cooling mechanism 30 to the side wall 12b of the second frame 12 is defined as R21, a thermal resistance from the side wall 12b of the second frame 12 to the first frame 11 is defined as R22, and a thermal resistance from the first frame 11 to the channel structure 15 is defined as R23.

In the second frame 12, the cooling mechanism 30 is disposed at the central portion of the upper surface of the rectangular upper wall 12a, and the side walls 12b extend downward from the periphery of the lower surface of the upper wall 12a. In the case where the thickness of the second frame 12 and the thickness of the first frame 11 are constant, the following relationships R11<R21 and R11+R12<R21+R22+R23 are established because thermal resistance depends on distance. That is, the heat from the driver ICs 23 is transferred preferentially to the cooling mechanism 30, so that the coolant stored in the cooling mechanism 30 cools the driver ICs 23. Further, the heat of the driver ICs 23 is prevented from being transferred to the channel structure 15 via the side walls 12b of the second frame 12 and the first frame 11.

As explained above, the head module 10 includes: the first frame 11 formed of metal and supporting the channel structure 15 in which the channels for the ink are formed and the actuator 21 for causing the liquid in the channels to be ejected; the driver ICs 23 electrically connected to the actuator 21 via the COF 20; and the second frame 12 formed of metal and including the four side walls 12b and the upper wall 12a that extends between the side walls 12b and that functions as the heat spreader. The driver ICs 23 are disposed between the side walls 12b, the second frame 12 is in contact with the first frame 11 at the lower surfaces of the side walls 12b, and the upper wall 12a of the second frame 12 is thermally connected to the driver ICs 23 at the lower surface of the upper wall 12a. In this configuration, the head module 10 dissipates the heat generated by the driver ICs 23 to the upper wall 12a of the second frame 12 and dissipates the heat of the channel structure 15 via the first frame 11 and the second frame 12.

In the second frame 12, the driver ICs 23 are thermally connected to the lower surface of the upper wall 12a, and the cooling mechanism 30 having the liquid chamber storing the coolant is disposed on the upper surface of the upper wall 12a opposite to the lower surface. The liquid chamber of the cooling mechanism 30 is defined by: the upper surface of the upper wall 12a of the second frame 12 which is opposite to the lower surface thereof to which the driver ICs 23 are thermally connected; and the side walls 30b that stand on the upper surface of the upper wall 12a. In this configuration, the heat generated by the driver ICs 23 is transferred to the cooling mechanism 30 via the upper wall 12a of the second frame 12, so that the cooling mechanism 30 cools the driver ICs 23. Further, the heat of the channel structure 15 is transferred to the cooling mechanism 30 via the first frame 11 and the second frame 12, so that the cooling mechanism 30 cools the channel structure 15.

In other words, the head module 10 includes: the first frame 11 formed of metal and supporting the channel structure 15 in which the channels for the ink are formed and the actuator 21 for causing the liquid in the channels to be ejected; the driver ICs 23 electrically connected to the actuator 21 via the COF 20; and the second frame 12 formed of metal and thermally connected to the first frame 11. The second frame 12 is shaped to surround the driver ICs 23. The driver ICs 23 are surrounded by the second frame 12 and thermally connected to the second frame 12. On the upper surface of the upper wall 12a of the second frame 12, the cooling mechanism 30 having the liquid chamber in which the coolant flows is disposed. In this configuration, the heat generated by the driver ICs 23 is transferred to the cooling mechanism 30 via the second frame 12, so that the cooling mechanism 30 cools the driver ICs 23. Further, the heat of the channel structure 15 is transferred to the cooling mechanism 30 via the first frame 11 and the second frame 12, so that the cooling mechanism 30 cools the channel structure 15.

The head module 10 includes the two diver ICs 23. The two driver ICs 23 are arranged in the right-left direction (as one example of "first direction") between the left side wall 12b and the right side wall 12b. (The first direction intersects the stacking direction described above.) In the cooling mechanism 30 of the second frame 12, the two openings 30c, which allow the coolant to flow in and out of the liquid chamber, are formed so as to be arranged in the right-left direction. In the liquid chamber of the cooling mechanism 30, the rib 30d is provided between the two openings 30c so as to extend in the front-rear direction (as one example of "second direction") intersecting the right-left direction. (The second direction intersects the first direction and the stacking direction described above.) The two driver ICs 23 are shaped like a rectangular parallelepiped and are disposed in the head module 10 such that the longitudinal direction of the driver ICs 23 coincides with the front-rear direction. In this configuration, owing to the rib 30d, the coolant that flows into the liquid chamber through one of the two openings 30c flows in the liquid chamber in one direction along one of the two drivers IC 23, then flows in a direction opposite to the one direction along the other of the two driver ICs 23, and reaches the other of the two openings 30c. Thus, the cooling mechanism 30 is capable of efficiently cooling the two driver ICs 23.

The head module 10 includes the FPC 16 electrically connected to the driver ICs 23. The through-hole 12e into which the FPC 16 is inserted is formed through the upper wall 12a of the second frame 12. The through-hole 12e is elongate in the right-left direction. In the second frame 12, the through-hole 12e is located on the rear-end side of the upper wall 12a in the front-rear direction (as one example of "one-end side in the second direction") which is near to the rear end of the upper wall 12a, and the two openings 30c of the cooling mechanism 30 are located on the front-end side of the upper wall 12a in the front-rear direction (as one example of "the other-end side in the second direction") which is near to the front end of the upper wall 12a. The configuration prevents interference between the FPC 16 that extends from the head module 10 and the members, such as a supply pipe and a discharge pipe, for allowing the coolant to flow in and out of the cooling mechanism 30.

In the head module 10, the through-hole 12e into which the FPC 16 is inserted is closed by the potting of the resin 17, namely, by a potting material. The head module 10 includes the gasket 14 that closes the contact portion of the first frame 11 and the second frame 12. The configuration prevents entry of foreign substances such as ink or dust into the space enclosed with the first frame 11, the second frame 12, and the channel structure 15.

In the head module 10, the thermal resistance R11 from the upper wall 12a of the second frame 12 to the liquid chamber of the cooling mechanism 30 is smaller than the thermal resistance R21 from the side wall 12b to the liquid chamber. This configuration makes it possible to cool, with higher priority, the driver ICs 23 held in contact with the lower surface of the upper wall 12a of the second frame 12.

In the present embodiment, the first frame 11 is formed of metal such as stainless steel, and the second frame 12 is formed of metal such as aluminum. The present disclosure is not limited to this configuration. The first frame 11 and the second frame 12 may be formed of metal other than aluminum, and the material may be suitably selected in consideration of strength, thermal conductivity, and the like. In the second frame 12, the cooling mechanism 30 is fixed by welding to the upper surface of the upper wall 12a. The present disclosure is not limited to this configuration. The cooling mechanism 30 may be formed integrally with the upper wall 12a and the side walls 12b.

The holder 13 is formed of stainless steel. The present disclosure is not limited to this configuration. The holder 13 may be formed of metal other than stainless steel or may be formed of a material other than metal. The gasket 14 is formed of rubber. The present disclosure is not limited to this configuration. The gasket 14 may be formed of a material other than rubber. Further, in place of the biasing member 25, there may be used a flat plate provided with a rubber member at its periphery. The rubber member may be disposed at positions corresponding to the elastic portions 25c. Further, the rubber member may be replaced with a leaf spring or a sponge.

The first frame 11, the second frame 12, the holder 13, the gasket 14, the channel structure 15, and the FPC 16 of the head module 10 may have any shape other than those illustrated above.

It is to be understood that the illustrated embodiment is described only by way of example and the disclosure is not limited to the details of the illustrated embodiment. It is to be further understood that the scope of the present disclosure is defined in the attached claims and includes all of changes equivalent in meaning and scope to the scope defined in the claims. That is, an embodiment obtained by combining technical means suitably modified within the scope of the claims is also included in the technical scope of the present disclosure.

What is claimed is:

1. A liquid ejection apparatus, comprising:
   a channel structure in which a channel is formed;
   an actuator stacked on the channel structure in a stacking direction, the actuator configured to cause a liquid in the channel to be ejected;
   a first frame formed of metal and stacked on the channel structure in the stacking direction;
   a driver integrated circuit (IC) electrically connected to the actuator; and a second frame formed of metal, the second frame including at least two side walls facing each other and an upper wall extending between the two side walls and extending in a direction orthogonal to the stacking direction, the second frame being thermally connected to the first frame, wherein the driver IC is disposed between the two side walls, and the upper wall of the second frame is thermally connected to the driver IC.

2. The liquid ejection apparatus according to claim 1, further comprising a flexible printed circuit (FPC) electrically connected to the driver IC, wherein a through-hole through which the FPC is inserted is formed in the upper wall of the second frame.

3. The liquid ejection apparatus according to claim 2, further comprising a closure member that closes the through-hole through which the FPC is inserted.

4. The liquid ejection apparatus according to claim 1, further comprising a gasket that closes a contact portion of the first frame and the second frame.

5. The liquid ejection apparatus according to claim 1, wherein the upper wall of the second frame and each of the two side walls of the second frame are continuous to each other such that heat transferred from the channel structure to the first frame is transferred to the second frame.

6. The liquid ejection apparatus according to claim 5, wherein the upper wall and the two side walls of the second frame are formed of an identical metal material and formed as one component such that heat transferred from the channel structure to the first frame is transferred to the second frame.

7. The liquid ejection apparatus according to claim 1, wherein the second frame is formed of a metal material having thermal conductivity that is greater than that of the first frame.

8. A liquid ejection apparatus, comprising:
a channel structure in which a channel is formed;
an actuator stacked on the channel structure in a stacking direction, the actuator configured to cause a liquid in the channel to be ejected;
a first frame formed of metal and stacked on the channel structure in the stacking direction;
a driver integrated circuit (IC) electrically connected to the actuator; and
a second frame formed of metal, the second frame including at least two side walls facing each other and an upper wall extending between the two side walls and extending in a direction orthogonal to the stacking direction, the second frame being thermally connected to the first frame, wherein the driver IC is disposed between the two side walls, and the upper wall of the second frame is thermally connected to the driver IC, and wherein a liquid chamber is formed on one side of the upper wall opposite to the other side thereof on which the driver IC is thermally connected.

9. The liquid ejection apparatus according to claim 8, comprising two driver ICs each as the driver IC, wherein the two driver ICs are arranged in a first direction between the two side walls, the first direction intersecting the stacking direction, and wherein two openings are formed in the second frame so as to be arranged in the first direction, the two openings allowing a coolant to flow in and out of the liquid chamber therethrough.

10. The liquid ejection apparatus according to claim 9, wherein a rib is formed between the two openings in the liquid chamber, the rib extending in a second direction intersecting the first direction and the stacking direction.

11. The liquid ejection apparatus according to claim 10, wherein the driver IC has a rectangular parallelepiped shape, and a longitudinal direction of the driver IC is parallel to the second direction.

12. The liquid ejection apparatus according to claim 9, further comprising a flexible printed circuit (FPC) electrically connected to the driver IC, wherein a through-hole through which the FPC is inserted is formed in the upper wall of the second frame, and wherein the through-hole is elongated in the first direction.

13. The liquid ejection apparatus according to claim 12, wherein the through-hole is formed on one-end side of the second frame in a second direction intersecting the first direction, the one-end side being near to one of opposite ends of the second frame in the second direction, and wherein the two openings are formed on the other-end side of the second frame in the second direction, the other-end side being near to the other of the opposite ends of the second frame in the second direction.

14. The liquid ejection apparatus according to claim 8, wherein the liquid chamber is defined by: a surface of the upper wall opposite to the other surface thereof thermally connected to the driver IC; and a side wall that stands on the other surface.

15. The liquid ejection apparatus according to claim 8, wherein a thermal resistance from the upper wall to the liquid chamber is smaller than a thermal resistance from the two side walls to the liquid chamber.

* * * * *